US010319630B2

(12) United States Patent
Zhang et al.

(10) Patent No.: US 10,319,630 B2
(45) Date of Patent: Jun. 11, 2019

(54) ENCAPSULATED DAMASCENE INTERCONNECT STRUCTURE FOR INTEGRATED CIRCUITS

(71) Applicants: STMicroelectronics, Inc., Coppell, TX (US); International Business Machines Corporation, Armonk, NY (US)

(72) Inventors: John H. Zhang, Fishkill, NY (US); Lawrence A. Clevenger, LaGrangeville, NY (US); Carl Radens, LaGrangeville, NY (US); Yiheng Xu, Hopewell Junction, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 271 days.

(21) Appl. No.: 13/629,411

(22) Filed: Sep. 27, 2012

(65) Prior Publication Data

US 2014/0084481 A1    Mar. 27, 2014

(51) Int. Cl.
| | |
|---|---|
| H01L 23/48 | (2006.01) |
| H01L 23/52 | (2006.01) |
| H01L 21/768 | (2006.01) |
| H01L 23/522 | (2006.01) |
| H01L 23/532 | (2006.01) |

(52) U.S. Cl.
CPC .. *H01L 21/76834* (2013.01); *H01L 21/76831* (2013.01); *H01L 23/5226* (2013.01); *H01L 23/53295* (2013.01); H01L 2924/0002 (2013.01)

(58) Field of Classification Search
CPC ......... H01L 21/76834; H01L 23/53295; H01L 21/76831; H01L 23/5226; H01L 2924/0002; H01L 23/5329; H01L 23/53271; H01L 23/53238; H01L 23/522; H01L 21/76841; H01L 23/53223; H01L 23/53266; H01L 28/75; H01L 29/4933; H01L 29/4941; H01L 33/0037
USPC ................................ 257/774, 758, 756, 751
See application file for complete search history.

(56) References Cited

U.S. PATENT DOCUMENTS

| | | | | |
|---|---|---|---|---|
| 5,795,823 | A | * | 8/1998 | Avanzino et al. ............ 438/639 |
| 6,110,776 | A | * | 8/2000 | Lee ........................ H01L 28/87 |
| | | | | 257/E21.016 |
| 6,358,838 | B2 | * | 3/2002 | Furusawa et al. ............ 438/622 |
| 7,115,465 | B2 | | 10/2006 | Marty et al. |
| 7,400,028 | B2 | * | 7/2008 | Tomita .................. H01L 23/522 |
| | | | | 257/620 |
| 2003/0057561 | A1 | | 3/2003 | Fukuyama et al. |
| 2005/0037604 | A1 | * | 2/2005 | Babich et al. ................ 438/619 |
| 2005/0051900 | A1 | | 3/2005 | Liu et al. |

(Continued)

FOREIGN PATENT DOCUMENTS

| | | |
|---|---|---|
| CN | 101221985 A | 7/2008 |
| CN | 203503649 U | 3/2014 |

*Primary Examiner* — Kimberly N Rizkallah
*Assistant Examiner* — Dilinh P Nguyen
(74) *Attorney, Agent, or Firm* — Seed IP Law Group LLP

(57) ABSTRACT

A plurality of metal tracks are formed in a plurality of intermetal dielectric layers stacked in an integrated circuit die. Thin protective dielectric layers are formed around the metal tracks. The protective dielectric layers act as a hard mask to define contact vias between metal tracks in the intermetal dielectric layers.

19 Claims, 23 Drawing Sheets

(56) References Cited

U.S. PATENT DOCUMENTS

| | | | |
|---|---|---|---|
| 2010/0087042 A1* | 4/2010 | Kim | H01L 23/5223 |
| | | | 438/396 |
| 2011/0007249 A1* | 1/2011 | Huang | 349/106 |
| 2011/0133255 A1 | 6/2011 | Merz | |
| 2012/0119307 A1 | 5/2012 | Li et al. | |
| 2012/0313153 A1 | 12/2012 | Zhang et al. | |
| 2013/0102124 A1* | 4/2013 | Nakazawa | 438/422 |

* cited by examiner

ENCAPSULATED DAMASCENE INTERCONNECT STRUCTURE FOR INTEGRATED CIRCUITS

BACKGROUND

Technical Field

The present disclosure relates to the field of integrated circuit design. The present disclosure relates more particularly to metal interconnections within an integrated circuit die.

Description of the Related Art

As integrated circuit technology continues to scale down to smaller technology nodes, the back end of the line connections become very challenging and complicated to implement. Complex patterning schemes such as double patterning are used to provide smaller and smaller interconnection features. Many problems can occur within the integrated circuits as vias and metal lines within the integrated circuit become smaller and closer together. These problems can include difficulty in alignment of photolithography masks during manufacture, as well as electromigration and time dependent dielectric breakdown during the life of the integrated circuit.

BRIEF SUMMARY

One embodiment is a method for forming metal interconnections in an integrated circuit die. First metal tracks are formed from a first metal layer on a substrate of an integrated circuit die. The first metal tracks are formed on a first intermetal dielectric layer covered in a relatively thin protective dielectric covering. A second intermetal dielectric layer is formed on the first intermetal dielectric layer and the first metal tracks. The first and second intermetal dielectric layers are selectively etchable with respect to the protective dielectric covering.

The second intermetal dielectric layer is then patterned and etched to form contact vias through the first and second intermetal dielectric layers. The patterned features of the mask used to open vias in first and second dielectric layers are comparatively large because the protective covering on the first metal tracks acts as a mask to form the vias because the protective covering is not etched by the etchant that opens the vias. Thus while a large opening may be made in the second dielectric layer above the first metal tracks, the vias are delimited in part by the protective dielectric layer on the sides of the first metal tracks and are small in spite of the comparatively large features of the photolithography mask. In this manner vias are formed through the first and second dielectric layers.

A conductive material is then deposited in the vias and over the second dielectric layer and protective layer. The conductive material is then removed over the second dielectric layer leaving patterned second metal tracks integral with the conductive plugs of the filled vias. A second thin protective dielectric layer covers the second metal tracks. The process can be repeated to form further metal tracks and vias above the first and second metal tracks.

DETAILED DESCRIPTION

Figure 21:
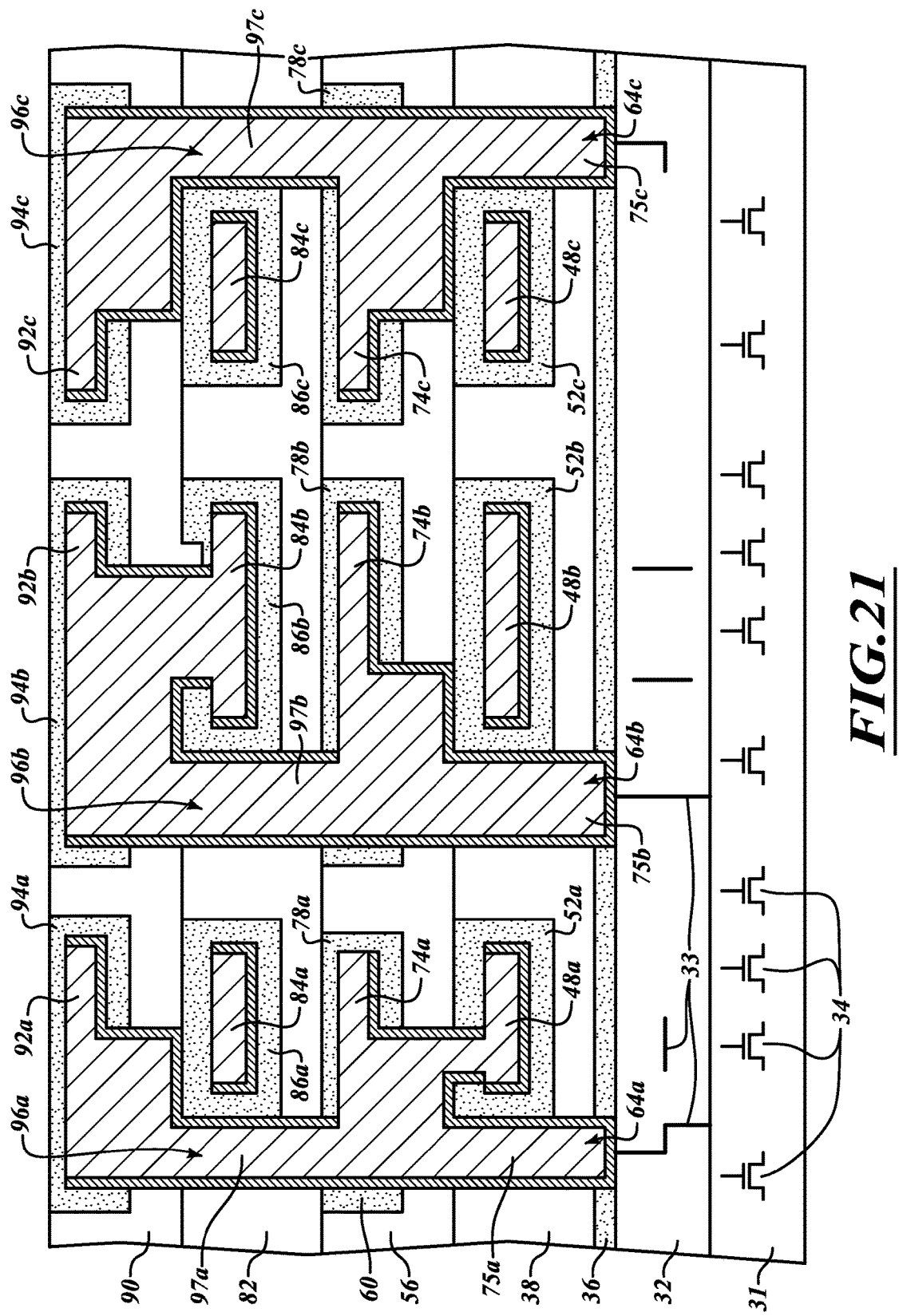
FIG. 21 is a cross section of an integrated circuit die having metal interconnections according to one embodiment.
Figure 22:
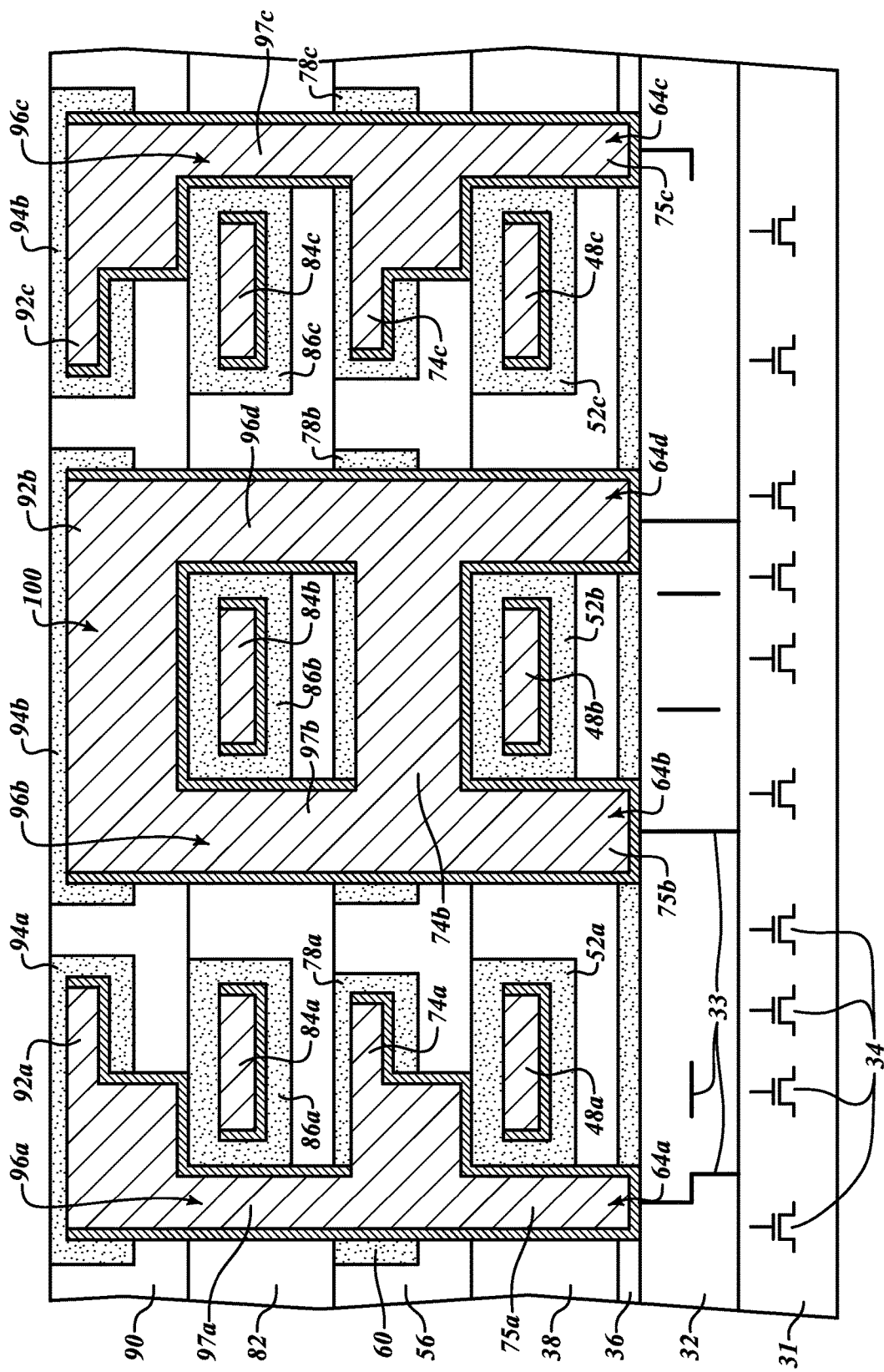
FIG. 22 is a cross section of an integrated circuit die having metal interconnections including double foot branch structure according to one embodiment.
Figure 23:
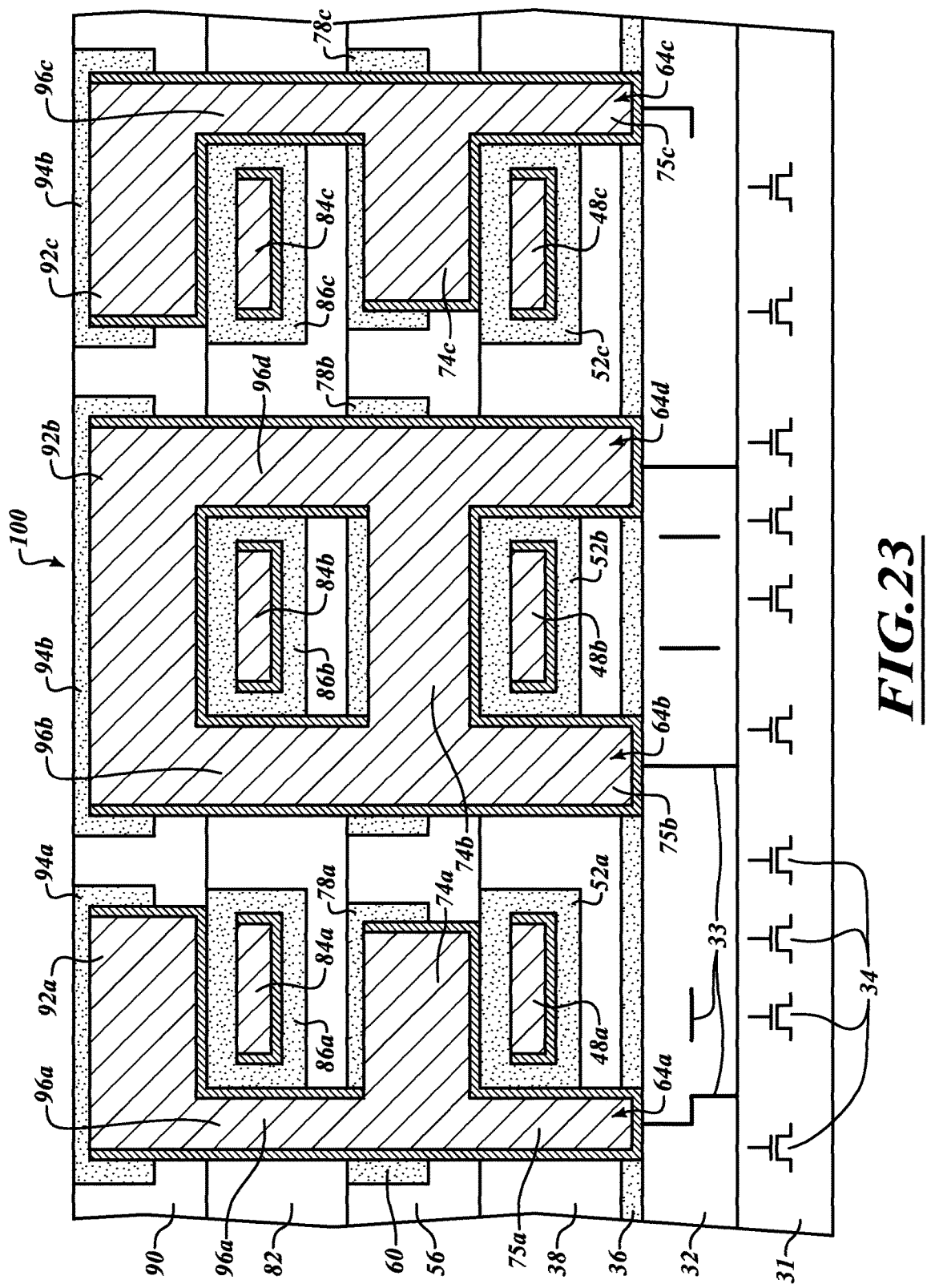
FIG. 23 is a cross section of an integrated circuit die having metal interconnections including a double foot branch structure according to a further embodiment.

FIGS. 1-20 illustrate a method for forming metal interconnections of an integrated circuit die according to one embodiment. Advantageously, some aspects of the metal interconnections can be formed using relaxed photolithographic constraints while providing relatively small features suitable for an integrated circuit die according to one embodiment. FIGS. 21-23 illustrate integrated circuit dies having metal interconnections according to some alternative embodiments.

Figure 1:
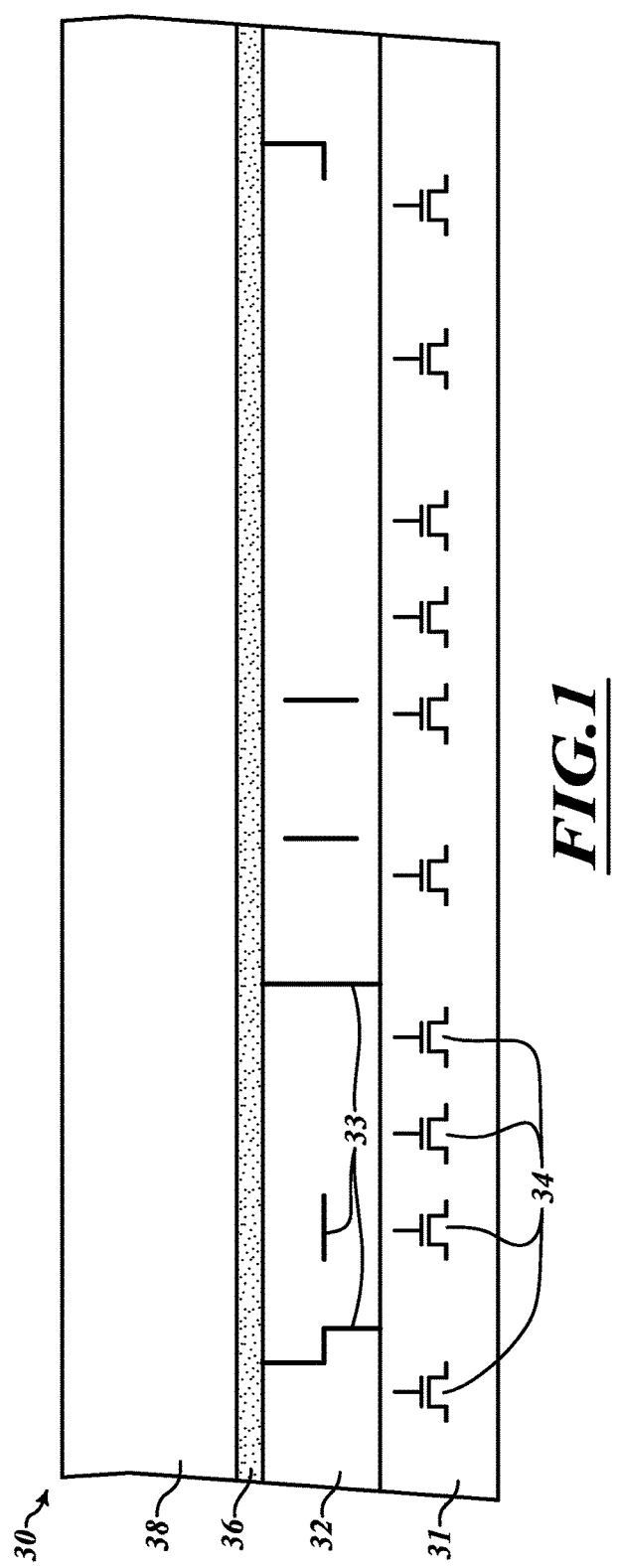
FIG. 1 is a cross section of an integrated circuit die according to one embodiment.

FIG. 1 is a cross section of an integrated circuit die 30 according to one embodiment. The integrated circuit die 30 includes a semiconductor substrate 31. Transistors 34 are formed in and on the semiconductor substrate 31. A dielectric layer 32 overlies the semiconductor substrate 31. Metal interconnections 33, shown only schematically as lines, are formed in the dielectric layer 32. A protective dielectric layer 36 overlies the intermetal dielectric layer 32. A first intermetal dielectric layer 38 overlies the protective dielectric layer The semiconductor substrate 31 is, for example, silicon or another suitable semiconductor layer in and on which transistors 34 can be formed.

The dielectric layer 32 is shown as a single layer in FIG. 1, however in practice the dielectric layer 32 can include conductive and dielectric layers set on top of the semiconductor substrate 31 in which transistors 34 are formed. The metal interconnections 33 can include metal tracks, vias, and signal lines be formed in the dielectric layer 32 below the protective dielectric layer 36. The metal interconnections 33 can provide connections to the transistors 34 below and to conductive structures which will be formed subsequently as described below.

The protective dielectric layer 36 is, for example, a silicon carbide layer with nitrogen, a silicon nitride layer, or a silicon nitride layer including carbon. The protective dielectric layer 36 is between 200-500 Å thick. In one example the protective dielectric layer 36 has dielectric constant K of about 3. Other suitable materials and dimensions may be used for the features described in FIG. 1.

The first intermetal dielectric layer 38 is, for example, a nanoporous dielectric layer between 600-1500 Å in thickness. As dimensions in the features of integrated circuits continue to shrink, the capacitance between conductive features of the integrated circuits begins to increase. For example, the capacitance between conductive features, such as metal tracks and vias formed in an integrated circuit die 30 increases as the distance between the features decreases. The capacitance between conductive features of the integrated circuit is also proportional to the dielectric constant of the material between them. For this reason, the first intermetal dielectric layer 38 is a low K dielectric layer. This means that the dielectric constant of the first intermetal dielectric layer 38 is comparatively small. This helps to reduce the capacitance between features formed in, on, or under the first intermetal dielectric layer 38. The intermetal dielectric layer 38 can be, for example, a porous dielectric, such as porous silicon dioxide or other porous material. Alternatively, the first intermetal dielectric layer 38 can be a material other than a porous dielectric layer, but still formed of a material having a very low dielectric constant. The dielectric layer 32 may also be formed of the same materials as the first intermetal dielectric layer 38.

Figure 2:
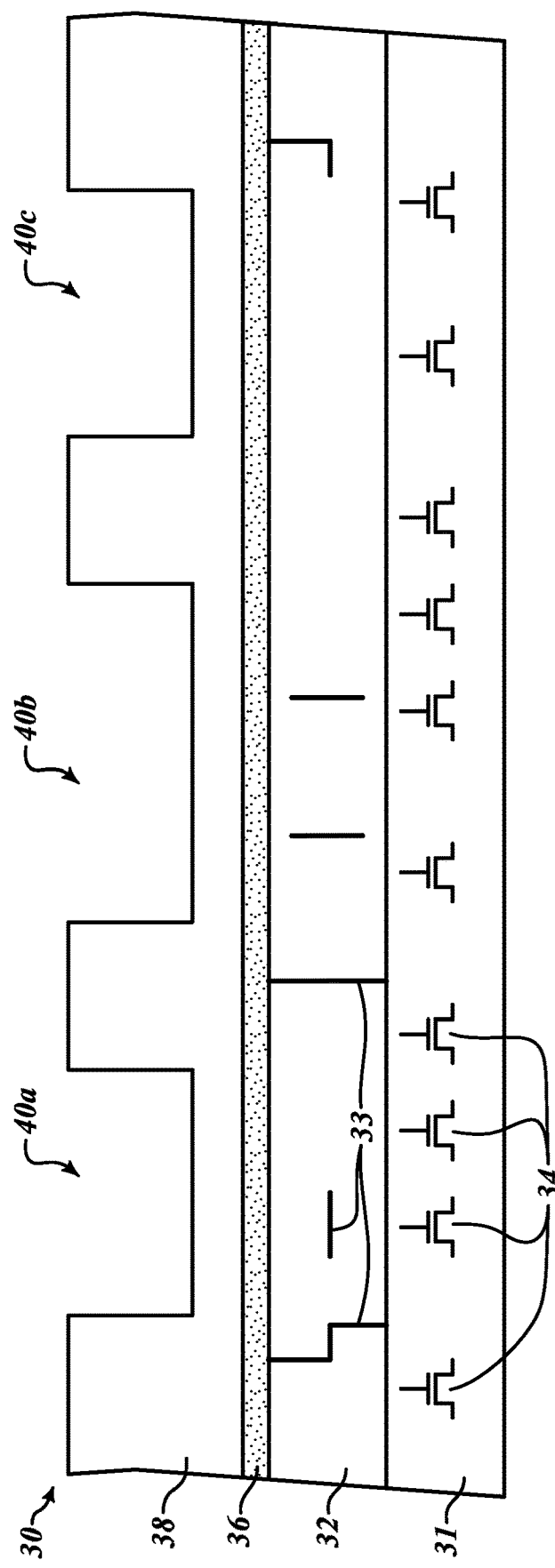
FIG. 2 is a cross section of an integrated circuit die in which trenches have been formed in a first intermetal dielectric layer according to one embodiment.

In FIG. 2, the first intermetal dielectric layer 38 is patterned and etched to open trenches 40a, 40b, and 40c in the first intermetal dielectric layer 38. The first intermetal dielectric layer 38 is not etched all the way to the protective dielectric layer 36. Instead, the intermetal dielectric layer 38 is etched using a time-based control to selectively etch to a selected depth. The depth of the trenches 40a, 40b, and 40c in FIG. 2 is, for example, 50-90 nm. The trenches 40a, 40b, and 40c in the first intermetal dielectric layer 38 can be opened by using a reactive ion etch. The time-based control which controls the depth of the reactive ion etch is, for example, a step height advanced process control. Such an advanced process control allows the etch to go to a particular depth without going further.

The width of the trenches 40a and 40c is, for example, 32 nm. The width of the trench 40b is wider than the trenches 40a and 40c for reasons that will be described more fully below. Many other suitable dimensions for the trenches 40a, 40b, and 40c can be selected according to the desired parameters of the integrated circuit die 30. Furthermore, etching techniques other than those described can be used to achieve the same or similar results, as desired.

Figure 3:
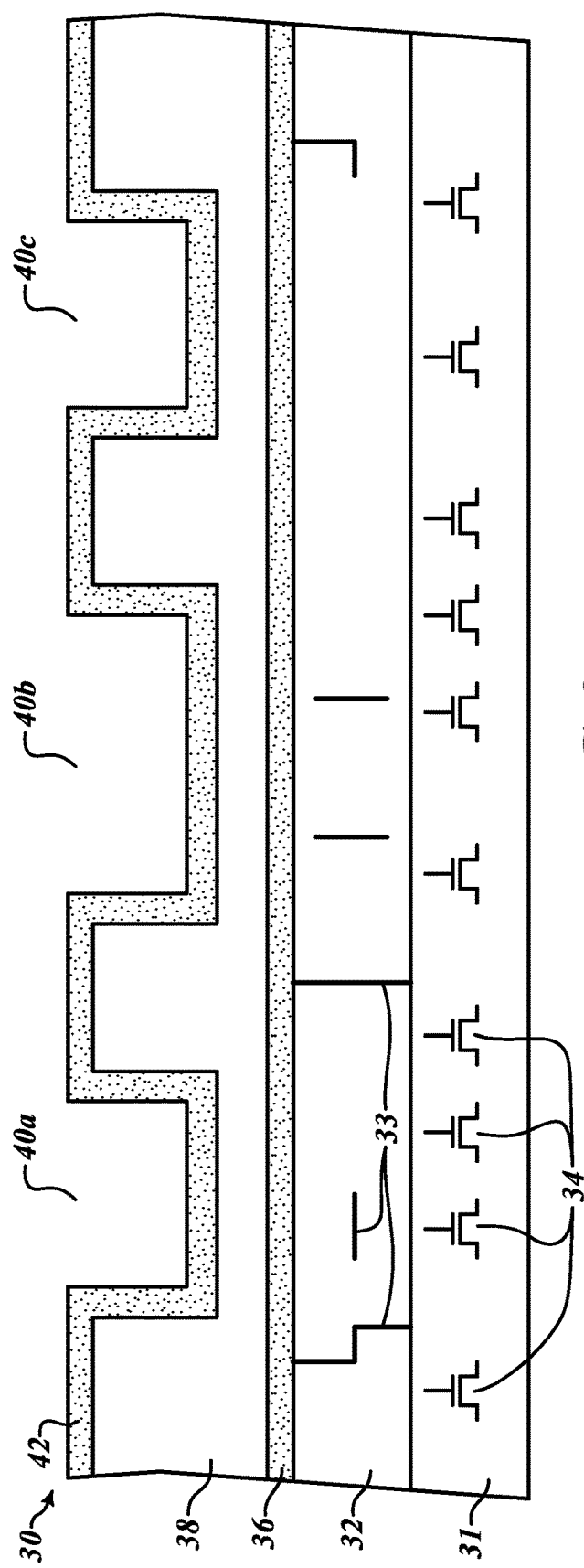
FIG. 3 is a cross section of an integrated circuit die in which a protective dielectric layer has been deposited in the trenches according to one embodiment.

In FIG. 3, a protective dielectric layer 42 is deposited on the first intermetal dielectric layer 38 and in the trenches 40a, 40b, and 40c. The protective dielectric layer 42 has a high etch selectivity with respect to the first intermetal dielectric layer 38. The protective dielectric layer 42 also has low K value while retaining high etch selectivity with respect to the first intermetal dielectric layer 38.

In one embodiment, the protective dielectric layer 42 is the same material as the protective dielectric layer 36, for example, a silicon carbide layer with nitrogen, a silicon nitride, silicon nitride layer, or a silicon nitride layer including carbon. Alternatively, the protective dielectric layer 42 can be a different material than that of the protective dielectric layer 36, but chosen from the same group of materials listed above. The protective dielectric layer 42 can also be of any other suitable material.

The protective dielectric layer 42 is, for example, 300-500 Å thick. The protective dielectric layer 42 can be deposited by chemical vapor deposition processes such as plasma enhanced chemical vapor deposition or low pressure chemical vapor deposition. The layer 42 is of a higher density than the dielectric layer 38 in the preferred embodiment, and a high density chemical vapor deposition process can be used. Alternatively the protective dielectric layer 42 can be formed using other suitable methods or processes.

Figure 4:
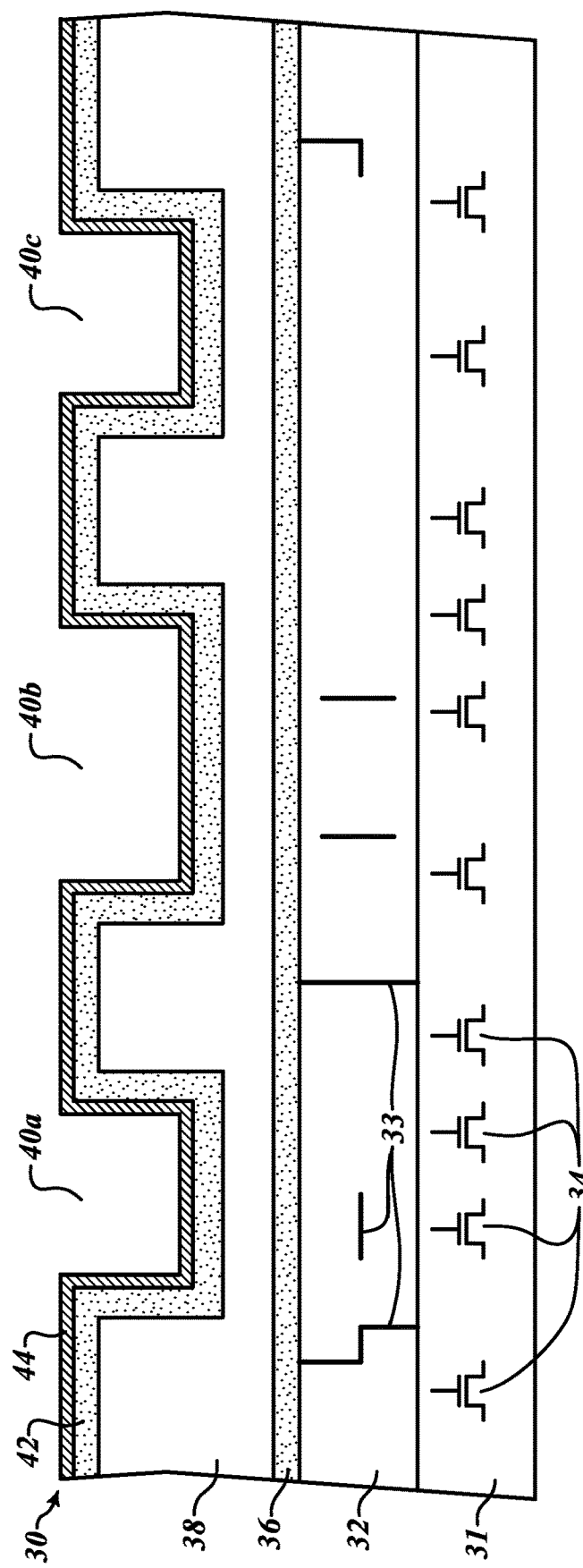
FIG. 4 is a cross section of an integrated circuit die having a barrier layer deposited on the insulator layer according to one embodiment according to one embodiment.

In FIG. 4, a thin barrier layer 44 is deposited on the protective dielectric layer 42 and in the trenches 40. The barrier layer 44 provides a barrier to keep mobile metal atoms from a metal track from entering dielectric layers. The barrier layer also acts as an adhesive layer for a subsequently deposited metal layer. The barrier layer 44 is, for example, one or more layers of titanium, titanium nitride, tantalum, or tantalum nitride. Alternatively other suitable materials can be used to form the barrier layer 44. When Ti and/or TiN are used, the barrier layer 44 is, for example, 4-20 Å thick. When Ta and/or TaN are used for the barrier layer 44, the barrier layer 44 is, for example, 60 Å thick. Of course other suitable thicknesses and materials can be used.

Figure 5:
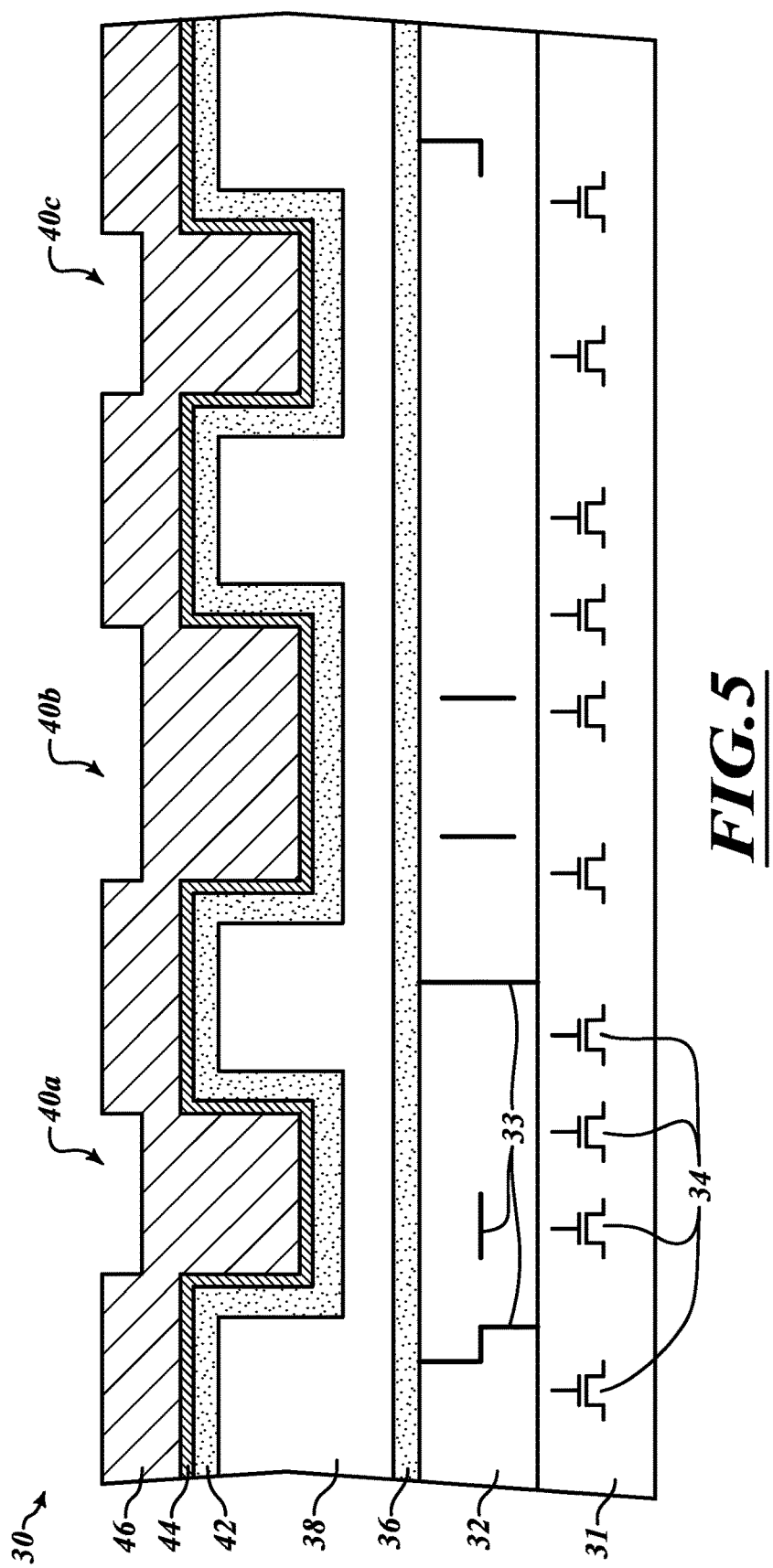
FIG. 5 is a cross section of an integrated circuit die having a conductive material on the barrier layer according to one embodiment.

In FIG. 5, a thick layer of conductive material 46 is deposited on the barrier layer 44 and in the trenches 40. The conductive layer 46 fills the trenches 40 and extends above the upper surface of the first intermetal dielectric layer 38. The conductive material 46 is in direct contact with the barrier layer 44.

The conductive material 46 is, in this example, copper. However, other suitable materials can be used for the conductive material 46. The conductive material can be formed using an electroplating and electroless process. In particular, the conductive material 46 can be deposited by first depositing a very thin copper seed layer in a physical vapor deposition (PVD) process. The seed layer is, for example, 10 nm thick. This is followed by an electroplating process that deposits a copper layer about 400 nm thick. Other suitable processes can be used to deposit the conductive material 46.

Figure 6:
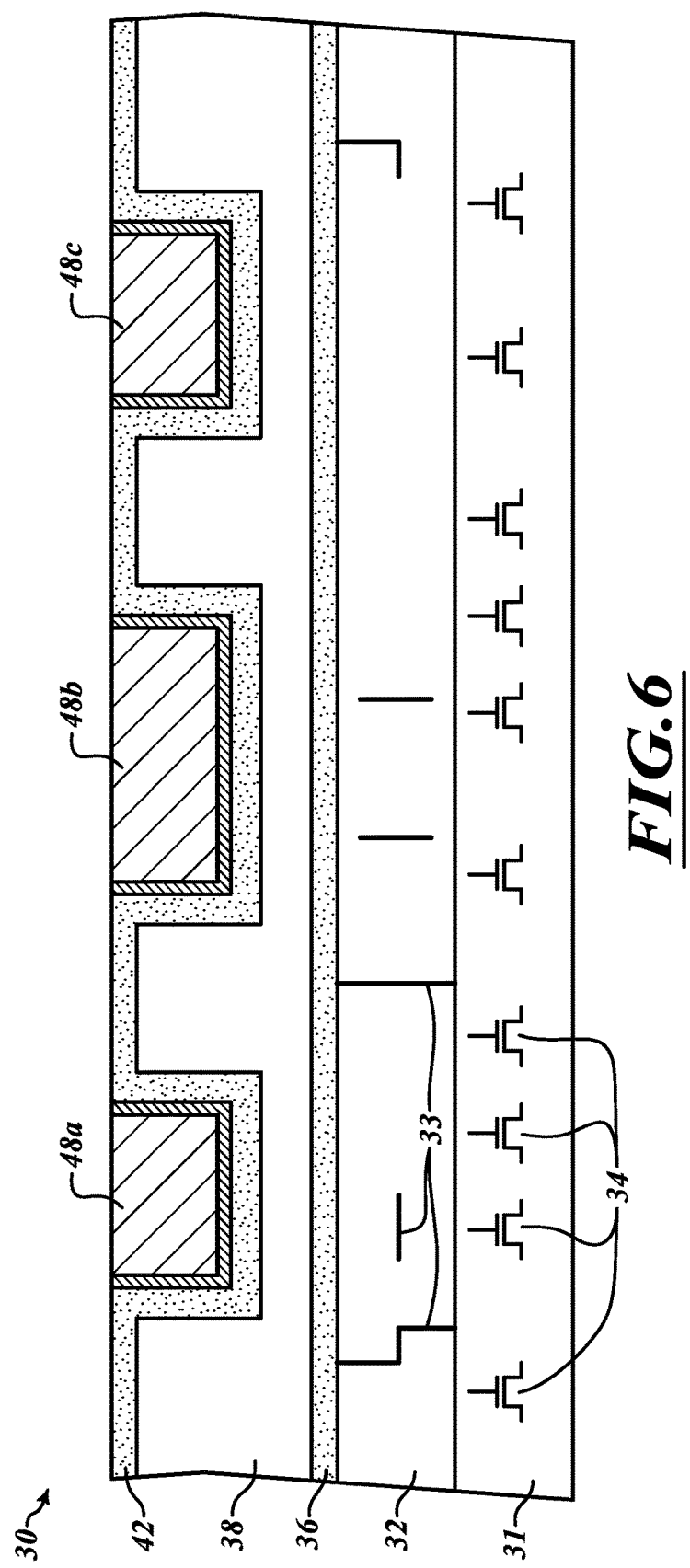
FIG. 6 is a cross section of an integrated circuit die the conductive material has been planarized to form first metal tracks according to one embodiment.

In FIG. 6, a planarization step has been performed to remove excess conductive material from the protective dielectric layer 42. The planarization step is, for example, a chemical mechanical planarization step configured to stop on the protective dielectric layer 42. This has the effect of removing excess conductive material while forming discrete first metal tracks 48a, 48b, and 48c from the conductive material 46 and the barrier layer 44. The first metal tracks 48a, 48b, and 48c have respective sides and bottom covered by the protective dielectric layer 42. The first metal tracks are formed from a first metal layer, or metal one. While the tracks 48a, 48b, and 48c are described as being formed in the first metal layer, it is understood that there may be more metal layers, and metal tracks formed thereof, below the first metal layer.

Figure 7:
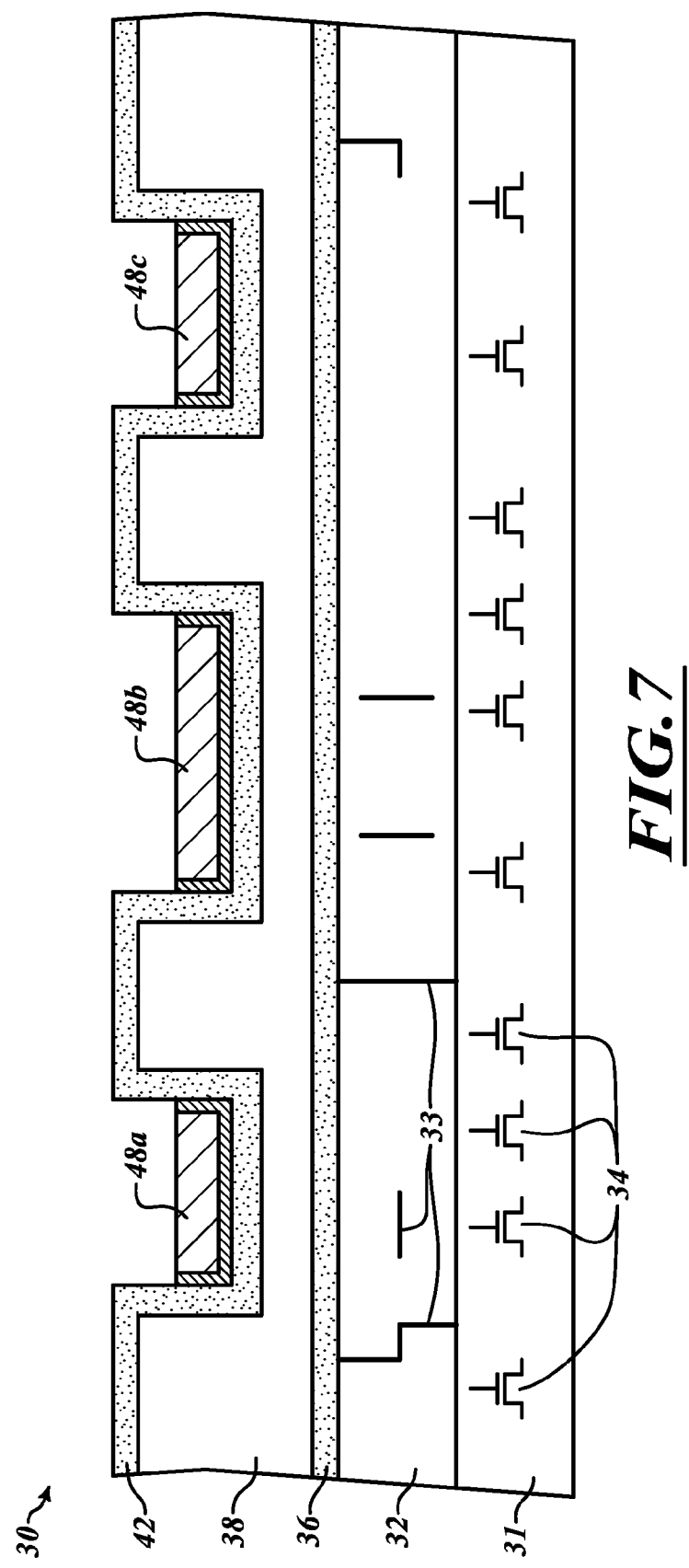
FIG. 7 is a cross section of an integrated circuit die after the first metal tracks have been reduced in thickness according to one embodiment.

In FIG. 7, a portion of the first metal tracks 48a, 48b, and 48c is removed. In one example, between 15 and 35 nm in thickness of the first metal tracks 48a, 48b, and 48c is removed. The removal of the top material of the first metal tracks 48a, 48b, and 48c can be done, for example, by a chemical mechanical planarization step which etches the first metal tracks 48a, 48b, and 48c faster than the protective dielectric layer 42. Alternatively, a reactive ion etch can be performed which also etches the copper faster than the protective dielectric layer 42. In this way, the material from the first metal tracks 48a, 48b, and 48c can be removed selectively with respect to the protective dielectric layer 42 without using a mask. In other words, whether done by CMP or reactive ion etching, no mask is used and because the etching process etches the first metal tracks 48a, 48b, and 48c much more quickly than it does the protective dielectric layer 42, the structure shown in FIG. 7 remains after the etch process. This leaves a gap between the tops of the metal tracks 48a, 48b, 48c and the top surface of the dielectric layer 38.

The metal tracks 48a, 48b, and 48c are conductive signal carrying lines which allow signals to be passed through the integrated circuit die 30, including to the transistors 34 and to metal contacts outside the integrated circuit die 30, such as contact pads, solder balls, or leads. While the tracks 48a, 48b, and 48c are described as being formed in the first metal layer, it is understood that the metal interconnections 33 and possibly other metal layers below the first metal layer may be present. The metal tracks 48a, 48b, and 48c, together with metal interconnections 33 and other metal interconnections in the integrated circuit die allow connection between transistors 34 formed in the semiconductor substrate and with components outside the integrated circuit die 30.

In one example the metal tracks 48a, 48b, and 48c are formed of copper. The barrier layer 34 is one or more layers of titanium, titanium nitride, tantalum, tantalum nitride or other suitable barrier layers. The metal tracks 48a, 48b, and 48c are, for example, 60-100 nm in thickness. The metal tracks 48a, 48b, and 48c are separated by 32 nm, 20 nm, or any suitable distance depending on the technology node and minimum dimensions being implemented. In many integrated circuits the metal tracks are formed of aluminum or aluminum copper due to difficulties in processing copper lines and vias. However, as the technology nodes decrease to smaller and smaller dimensions, copper is preferred for metal tracks and vias in integrated circuit dies due to high conductivity and other parameters. Any suitable metals and other materials may be used for the metal tracks, vias, and barrier layers.

Figure 8:
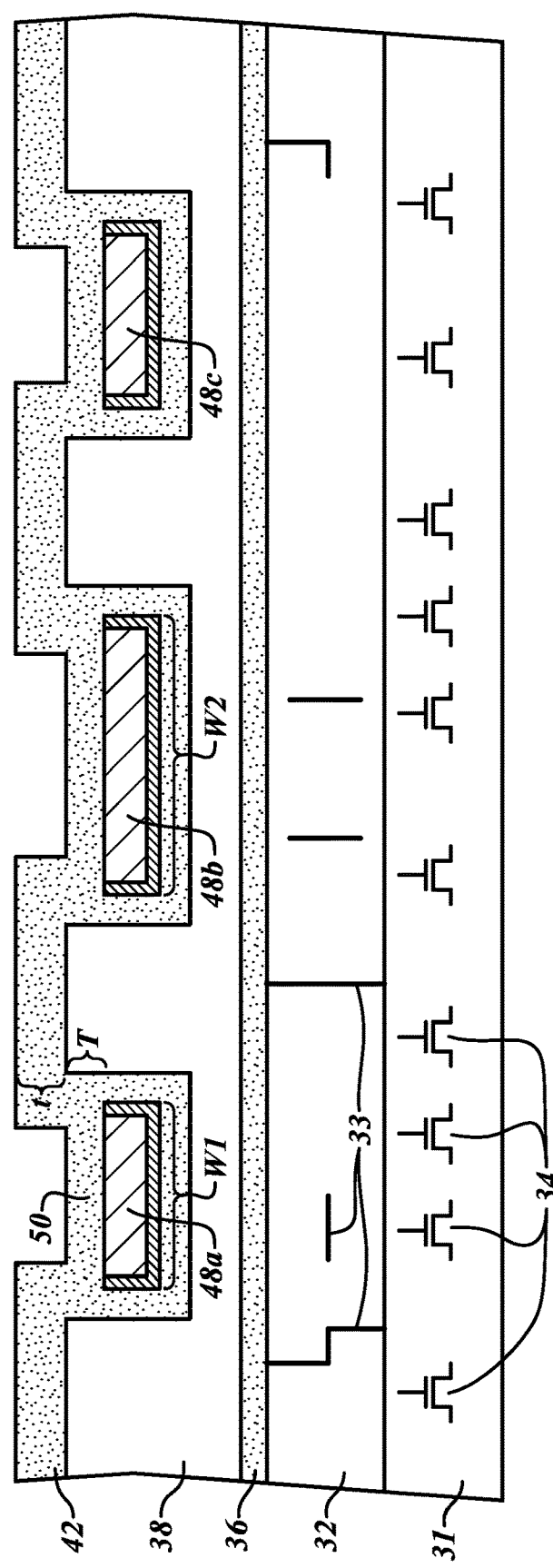
FIG. 8 is a cross section of an integrated circuit die after a protective dielectric layer has been formed on the first metal tracks according to one embodiment.

In FIG. 8, a protective dielectric layer 50 is deposited on top of the first metal tracks 48a, 48b, 48c and on top of the protective dielectric layer 42. The protective dielectric layer 50 is preferably the same material as the protective dielectric layer 42, but could be of a different material having the desired etch selectivity and with respect to the dielectric layer 38 and robustness. The protective dielectric layer 50 has thickness t on top of the dielectric layer 38. The thickness of the recess between the metal tracks 48a, 48b, 48c and the top of the dielectric layer 38 is T. The metal track 48a has a width W1 and metal track 48b has a width W2.

Satisfying certain relationships between the widths and thickness of the metal tracks and dielectric protection layer can help to ensure that some portion of the protective dielectric layer 50 will remain on the top surface of the wider metal track 48b after the planarization step. For example, in one embodiment the width W1 of the metal track 48a is less than two times thickness t of the dielectric protection layer 50. The width W2 of the metal track 48b is more than three times the thickness T of recess between the metal track 48a and the top surface of the dielectric layer 38. Satisfying these relationships of width and thickness can aid in reducing a number of masks to be used for future processing steps. In particular, when the protective dielectric layer 50 is planarized as will be shown in FIG. 9, more of the protective dielectric material will be removed from the wider metal track 48b. This reduced thickness of protective dielectric layer 50 on the metal track 48b can be taken advantage of in future processing steps. However, it is desirable that some that some portion of the protective dielectric layer 50 remains after the planarization step.

In one example the integrated circuit die 30 is processed according to the 20 nm technology node. In such an example, W1 is 32 nm, W2 is 64 nm, t is 20 nm and T is 30 nm. The features in the figures are not drawn to scale, and as drawn may not properly satisfy the relationships described above. However, in practice the thicknesses and depths of the structures shown in FIG. 8 can be made to satisfy the relationships described above. Alternatively, these relationships can be left unsatisfied according to other embodiments. For example, all of the metal tracks 48a, 48b, and 48c can have the same widths, or the thicknesses t, and T can be different than described above.

Figure 9:
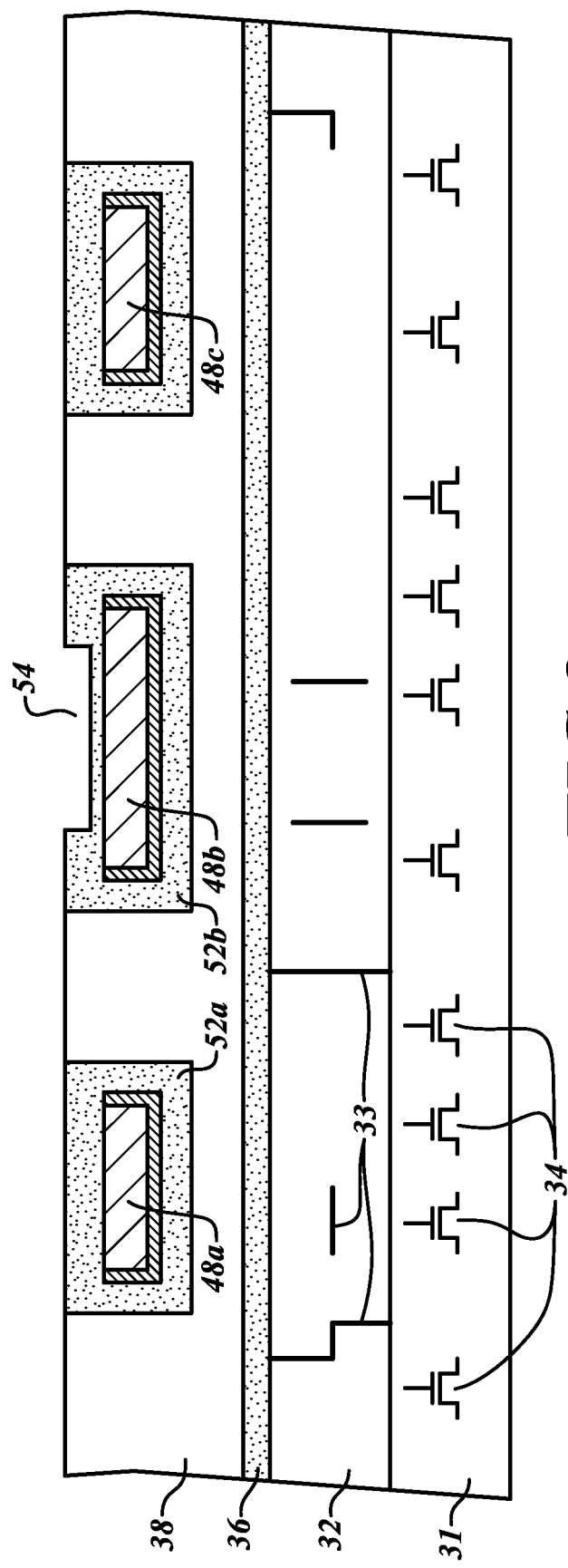
FIG. 9 is a cross section of an integrated circuit die after a portion of the protective dielectric layer has been removed according to one embodiment.

In FIG. 9, the aforementioned planarization process is performed to remove excess protective dielectric material of the protective dielectric layer 50 on top of the first intermetal dielectric layer 38. One example of the planarization process is a chemical mechanical planarization process configured to stop at the first intermetal dielectric layer 38. This leaves second metal lines 48a, 48b, and 48c that are encapsulated with respective dielectric encapsulation layers 52a, 52b. The dielectric encapsulation layers 52a, 52b are formed from remnants of the protective dielectric layers 42, 50. As described previously, the first intermetal dielectric layer 38 is selectively etchable with respect to the dielectric encapsulation layers 52a, 52b encapsulating the first metal tracks 48a, 48b, and 48c.

Having first metal tracks 48a, 48b, and 48c encapsulated in a dielectric encapsulation layers 52a, 52b helps to avoid some of the problems which come with further downscaling of the dimensions of metal lines, dielectric layers, and vias. For example, in a metal line encapsulated only by a low K dielectric layer or even a common dielectric layer, the problem of electromigration of metal atoms from the metal tracks into the dielectric material occurs. This can cause serious problems in the integrated circuit. For example, if the metal track is made of copper, and copper atoms migrate into a porous low K dielectric, not only does the quality of the metal track decrease, but copper atoms can migrate from the metal tracks through the porous dielectric material into sensitive areas. The dielectric encapsulation layers 52a, 52b help to prevent this problem because they are less porous and more robust than the intermetal dielectric layer 38.

Another problem that can occur with downscaling of components of the integrated circuit die 30 is time-dependent dielectric breakdown. As currents are carried through the metal tracks, damage can occur to dielectric material surrounding the metal tracks. This is especially true for low K dielectric materials that are used as inter level dielectric layers as described previously.

Encapsulating the metal tracks in high density insulating dielectric encapsulation layers 52a, 52b protects the integrated circuit die 30 from time-dependent dielectric breakdown. The metal lines encapsulated in the dielectric encapsulation layers 52a, 52b can also carry higher voltages. This allows for an increased usage range of the integrated circuit die 30. Such an integrated circuit die 30 can be used in both low voltage and high voltage applications.

The dielectric encapsulation layers 52a, 52b are relatively thin layers about 200-500 Å thick. An indentation 54 in the dielectric encapsulation layer 52b on top of the wider metal track 48b is present due to the width of the metal track 48b as described previously. Because the dielectric encapsulation layers 52a, 52b are thin and robust, a thicker low K dielectric material can fill the space between first metal tracks 48a, 48b, and 48c thereby providing the low capacitance benefits of a low K dielectric material while providing robust insulation against time dependent dielectric breakdown and electromigration.

Figure 10:
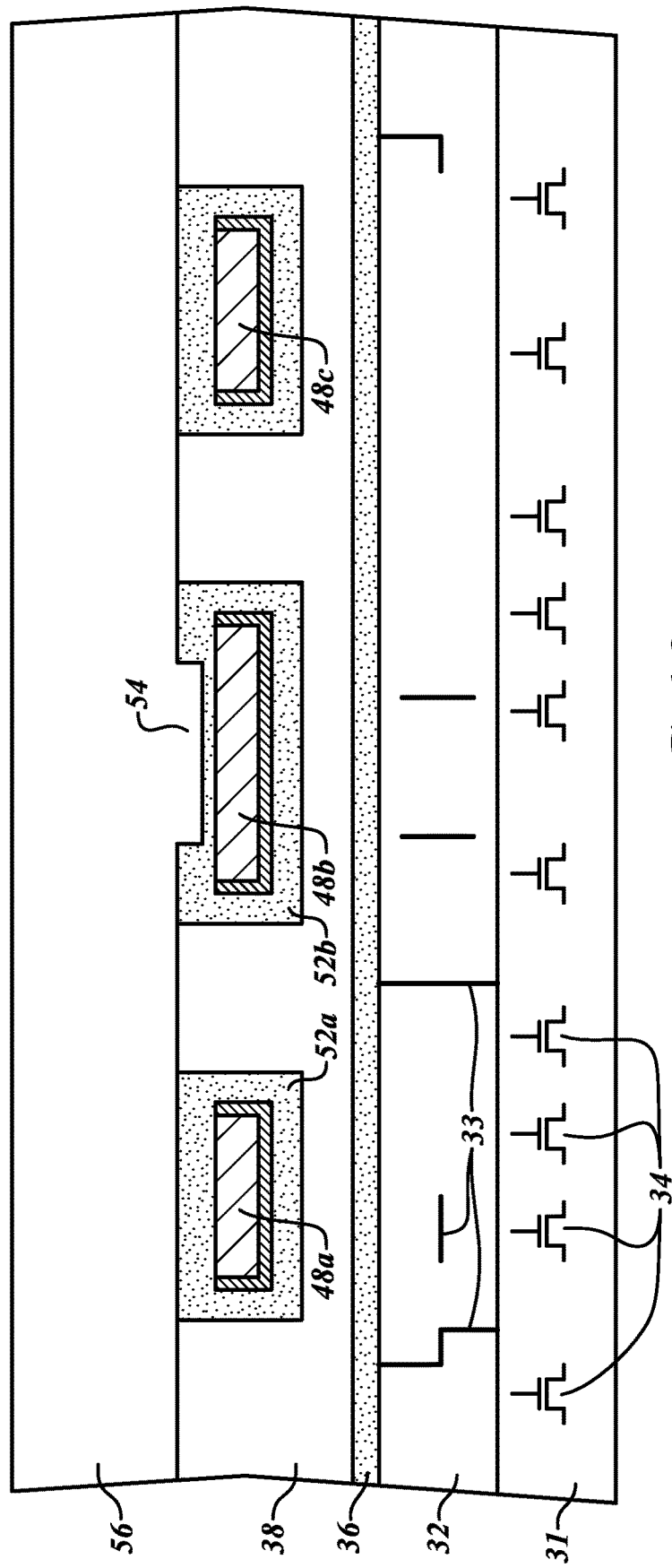
FIG. 10 is a cross section of an integrated circuit die having a second intermetal dielectric layer on the first intermetal dielectric layer and the protective dielectric layer according to one embodiment.

In FIG. 10, a second intermetal dielectric layer 56 has been deposited on the first intermetal dielectric layer 38 and on the dielectric encapsulation layers 52a, 52b. The second intermetal dielectric layer 56 is also a low K dielectric layer or other suitable dielectric layer. The second intermetal dielectric layer is selectively etchable with respect to the dielectric encapsulation layers 52a, 52b. The second intermetal dielectric layer can include multiple layers, such as silicon oxide layers, porous dielectric layers, or other suitable dielectric layers. The intermetal dielectric layer 56 is, for example, 1000 Å thick.

Figure 11:
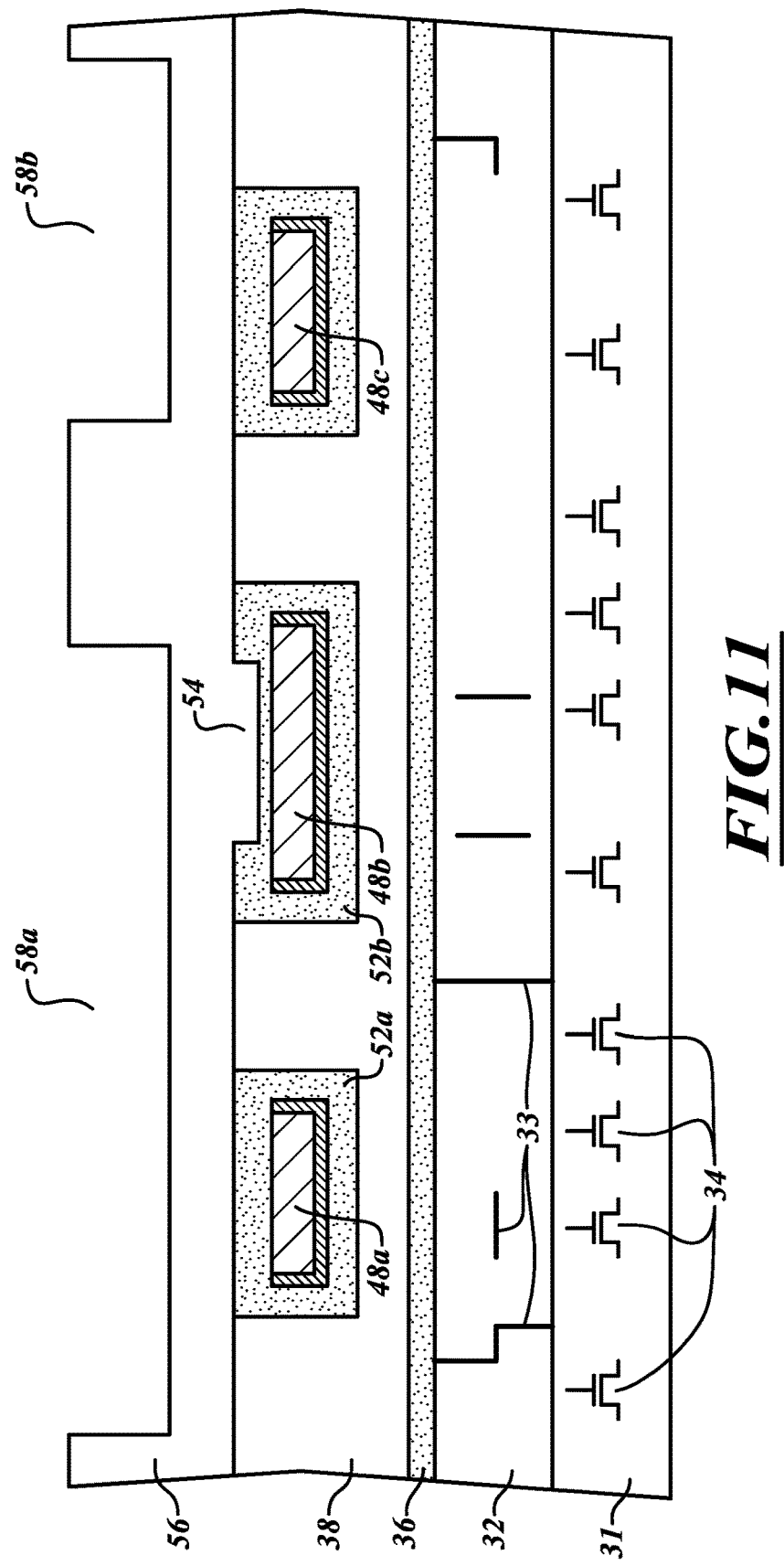
FIG. 11 is a cross section of an integrated circuit die having trenches formed in the second intermetal dielectric layer according to one embodiment.

In FIG. 11, the second intermetal dielectric layer 56 is patterned and etched to open wide trenches 58a, 58b. The depth of the trenches is, for example, 500 Å. The trenches 58a are placed over the first metal tracks 48a, 48b, and 48c. The trench 58b is placed over metal track 48c. The trenches 58a, 58b can be opened using a reactive ion etch, wet etch, or any other suitable process such as those described previously.

Figure 12:
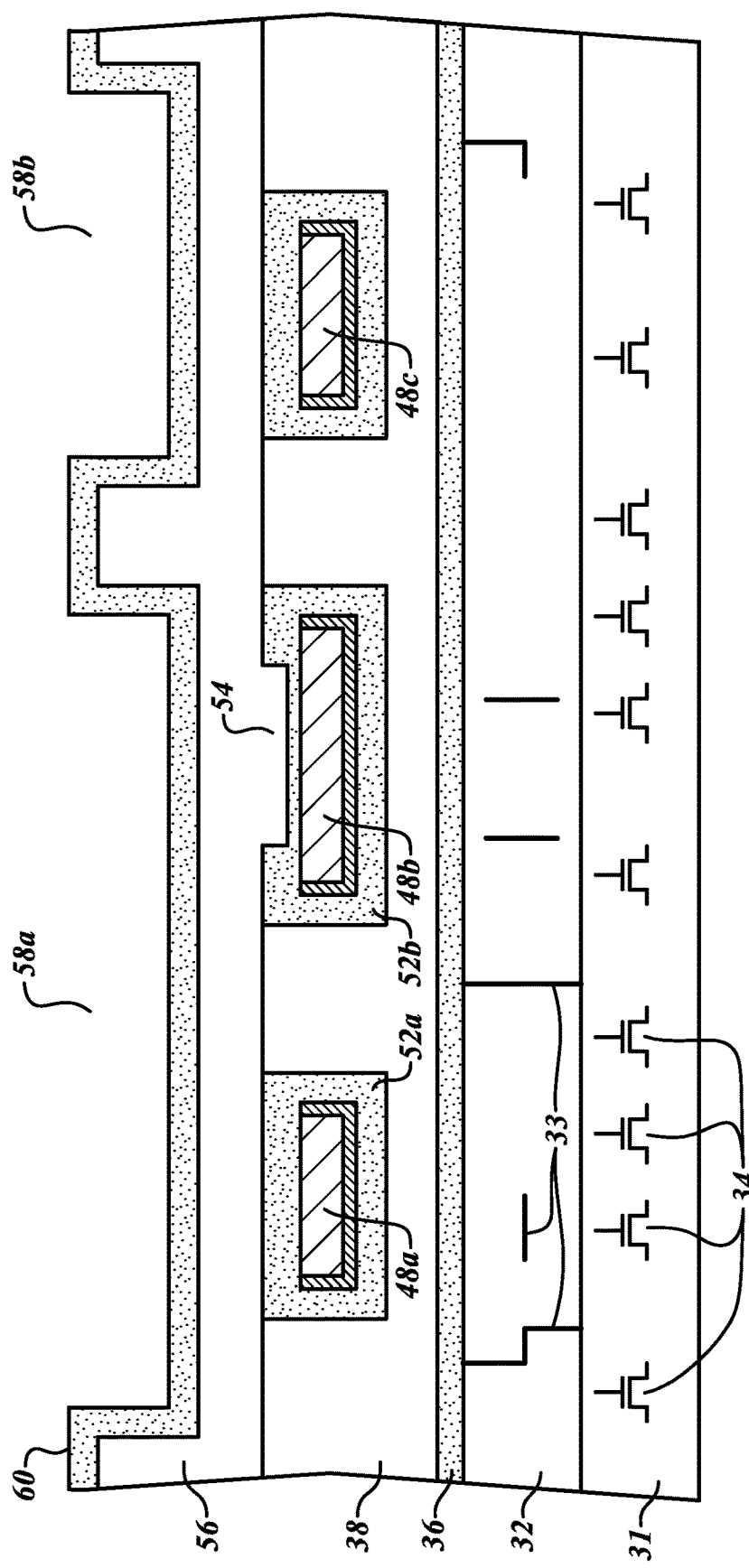
FIG. 12 is a cross section of an integrated circuit die having a protective dielectric layer formed on the second intermetal dielectric layer according to one embodiment.

In FIG. 12, a protective dielectric layer 60 is deposited on the second intermetal dielectric layer 56 and in the trenches 58a, 58b. The protective dielectric layer 60 is preferably of the same material as the dielectric encapsulation layers 52a, 52b, but other suitable materials can be used. As described previously, the protective dielectric layer 60 has a high etch selectivity with respect to the second intermetal dielectric layer 56. Preferably, the protective dielectric layer 60 also has as low of a K value as possible while retaining high etch selectivity with respect to the second intermetal dielectric layer 56. The protective dielectric layer 60 is, for example, 300-500 Å thick.

Figure 13:
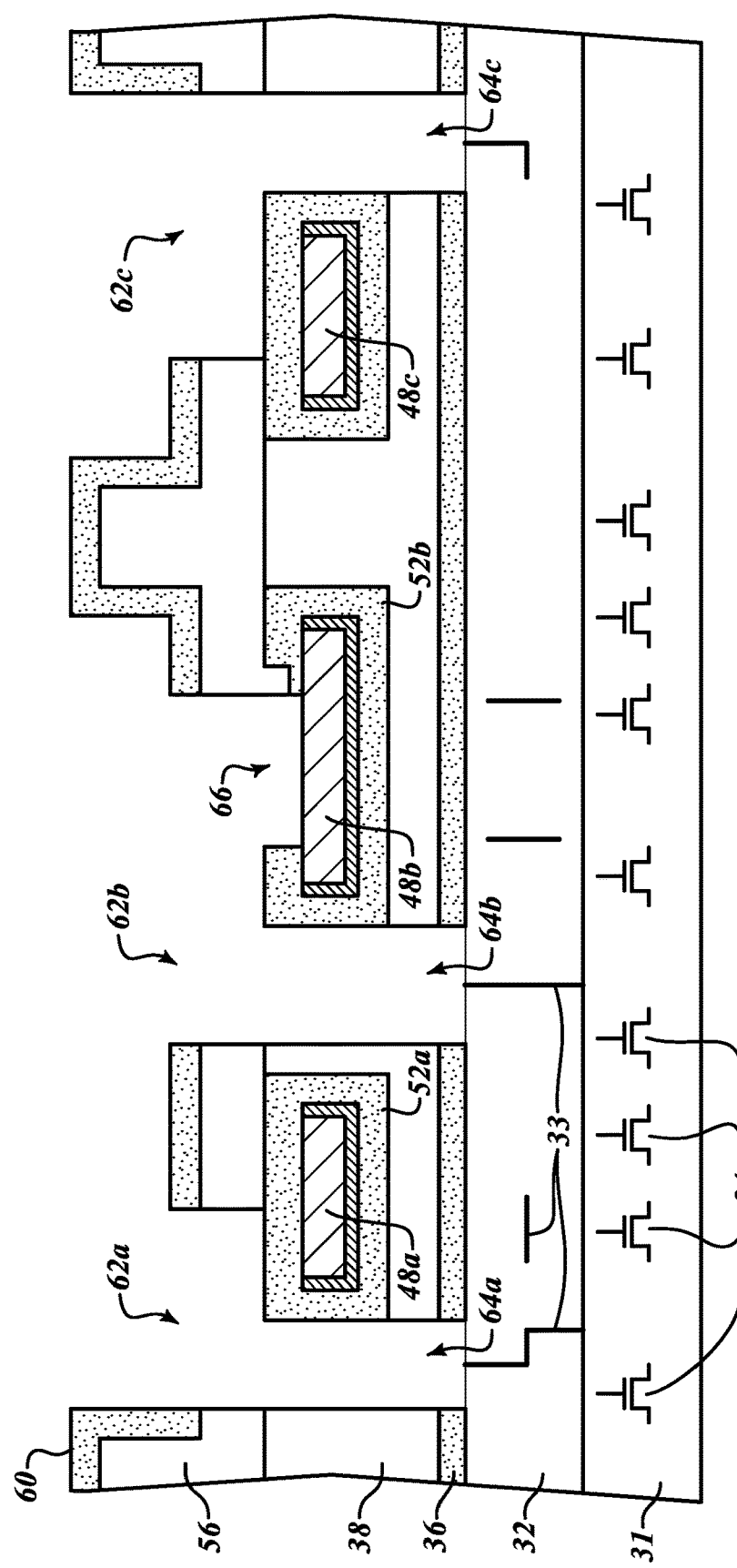
FIG. 13 is a cross section of an integrated circuit die having openings formed through the first and second intermetal dielectric layers according to one embodiment.

In FIG. 13, the trenches 58a and 58b are further etched to make further openings 62a, 62b, and 62c. The opening 62a includes via 64a which extends through the first and second intermetal dielectric layers 38, 56. Similar vias 64b and 64c are formed in the openings 62a, 62b, and 62c.

The vias 64a, 64b, and 64c can be made to expose metal interconnections 33 below the protective dielectric layer 36, not illustrated.

Alignment of the vias 64a, 64b, and 64c is easily accomplished because the dielectric encapsulation layers 52a and 52b surrounding the first metal tracks 48a and 48b act as a mask or an etch stop for the etchant that etches the first and second intermetal dielectric layers 38 and 56. Depending on the type of interconnecting vias to be formed, this can either eliminate the need for an extra mask or it can greatly reduce alignment errors because the vias 64a, 64b, and 64c will be self-aligned with the dielectric encapsulation layers 52a and 52b. Openings can be formed in the protective dielectric layer 36 by changing the etch chemistry after etching the dielectric layers 38 and 56. In one embodiment the protective dielectric layer 36 is of a different material than the dielectric encapsulation material 50 and has a different etch chemistry. In this way, after the dielectric layers 38 and 56 have been etched, the etch chemistry can be changed to an etchant that etches the protective dielectric layer 36 selectively with respect to the dielectric encapsulation layer 52a. When the protective dielectric layer 36 is the same material as the dielectric encapsulation later 52a, a separate mask can be used to etch the protective dielectric layer 36. Any suitable method can be used to etch the protective dielectric layer 36.

A direct via 66 is also formed to expose the first metal track 48b. The direct via 66 is formed in the same etch step that forms the vias 64a, 64b, and 64c. This is enabled because the dielectric encapsulation layer 52b is thinner on a top portion of the metal track 48b as described previously. It is thin enough that the etch exposes the surface of the metal track 48b while not etching entirely through the thicker portions of the dielectric encapsulation layers 52a and 52b. A direct via is a via that connects a metal track of one metal layer to a metal track of the metal layer immediately below.

Figure 14:
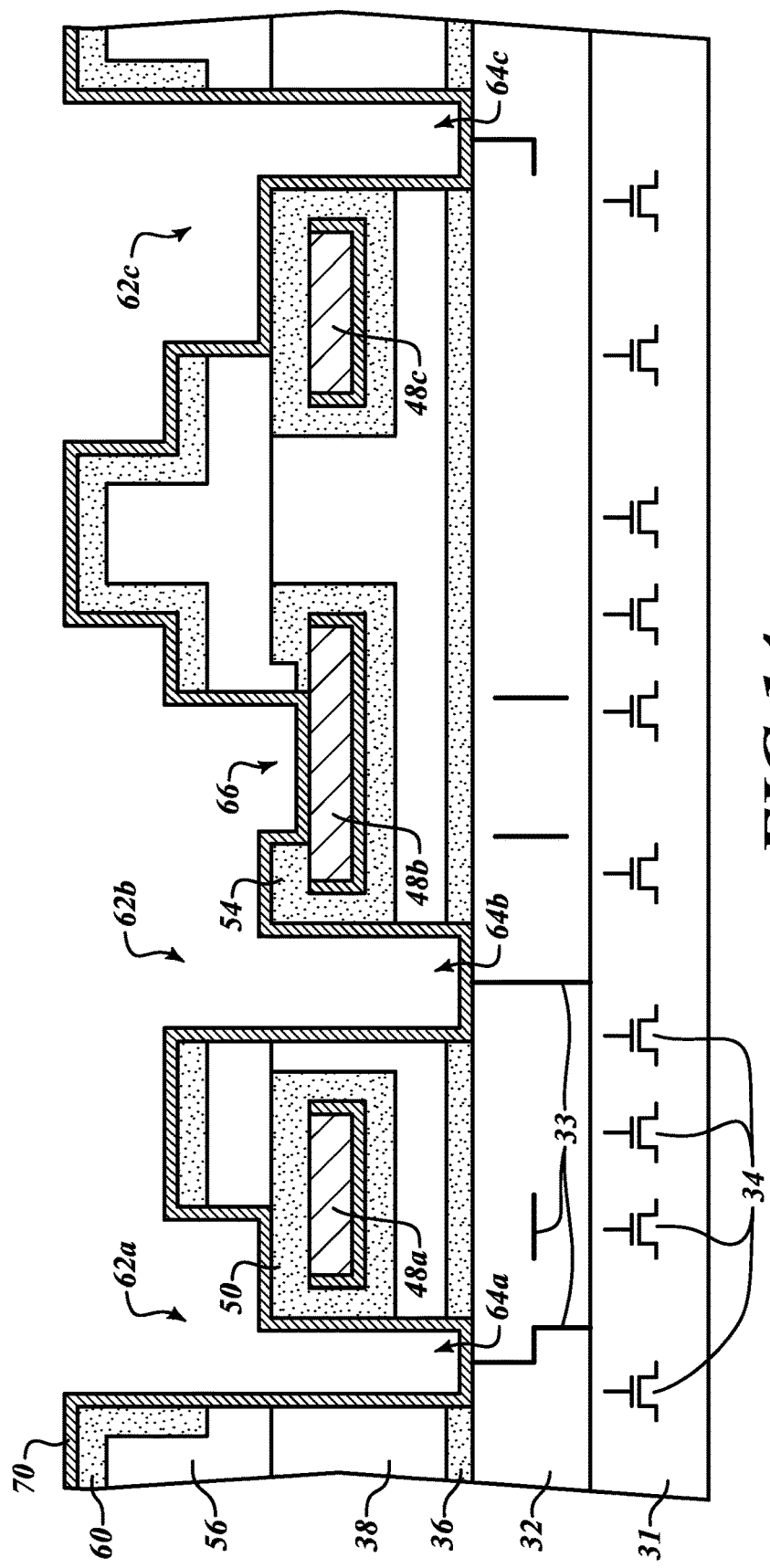
FIG. 14 is a cross section of an integrated circuit die having a metal barrier layer in the openings in the first and second intermetal dielectric layers according to one embodiment.

In FIG. 14, a barrier layer 70 is deposited in the openings 62a, 62b, and 62c lining the sidewalls and top surfaces of the layers and structures shown in FIG. 14. The barrier layer 70 is thus in contact with the first and second intermetal dielectric layers, 38, 56. The barrier layer 70 is in contact with the exposed portion of the metal track 48b and may be in contact with metal tracks below the metal tracks 48a, 48b, and 48c and not illustrated. The barrier layer 70, as described previously, can be titanium or a combination of titanium, titanium nitride, tantalum, and tantalum nitride or any other suitable materials for a barrier layer.

Figure 15:
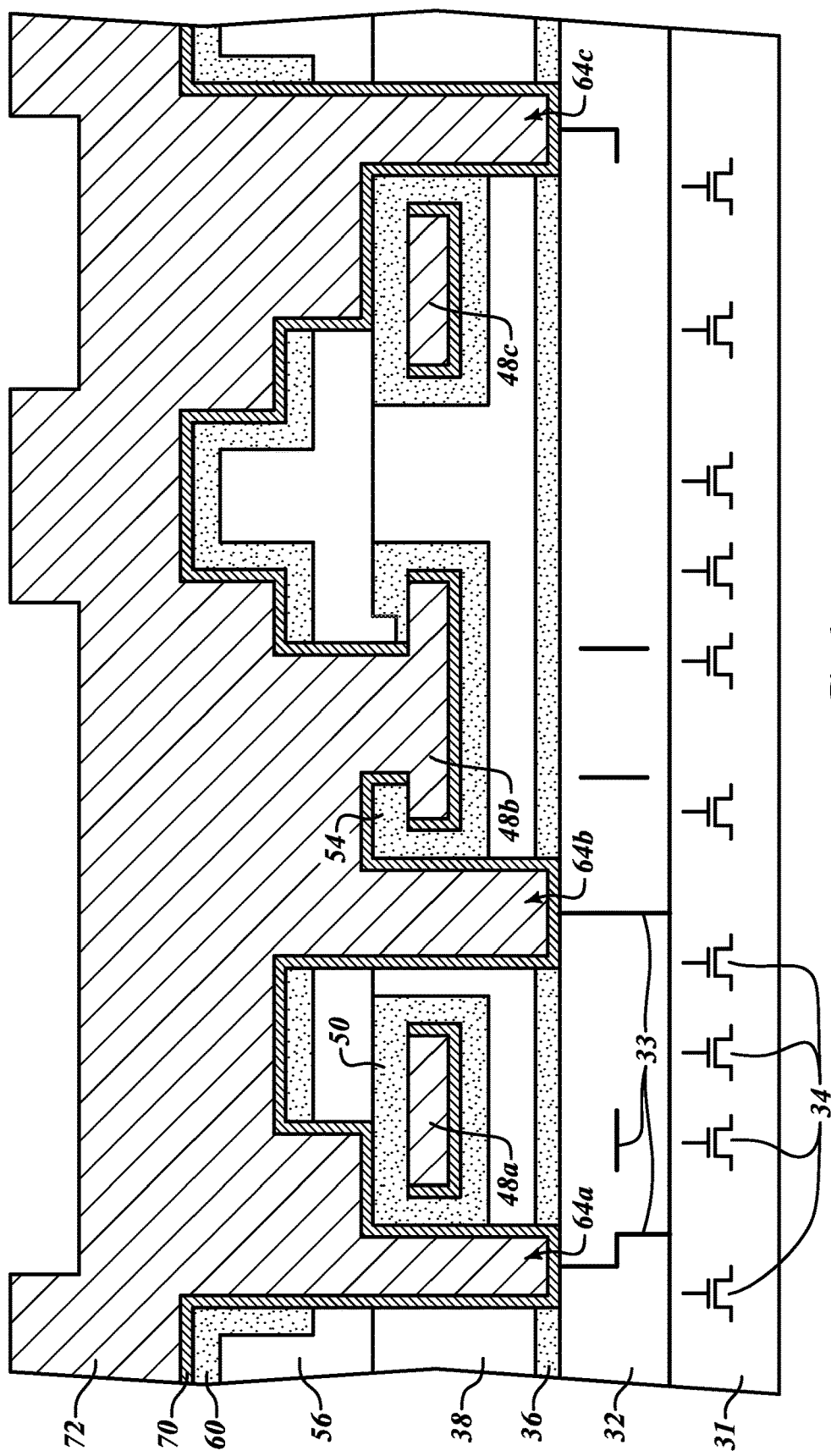
FIG. 15 is a cross section of an integrated circuit die having a metal layer filling the openings in the first and second intermetal dielectric layers according to one embodiment.

In FIG. 15, a conductive material 72 is deposited in the openings 62a, 62b and 62c. The conductive material 72 is on the barrier layer 70 on the second intermetal dielectric layer 56. The conductive material 72 is placed in a very thick layer which exceeds the height of the second intermetal dielectric layer 56. The conductive material 72 is preferably copper. However, other suitable conductive materials can be used according to the dimensions of the integrated circuit and other considerations. In one embodiment, the conductive material 72 is the same material as the first metal tracks 48a, 48b, and 48c. Alternatively, the conductive material 72 can be a different material than the first metal tracks 48a, 48b, and 48c. The conductive material 72 can be placed using an electroplating process or a combination of electroless and electroplating processes or in any other suitable manner.

Figure 16:
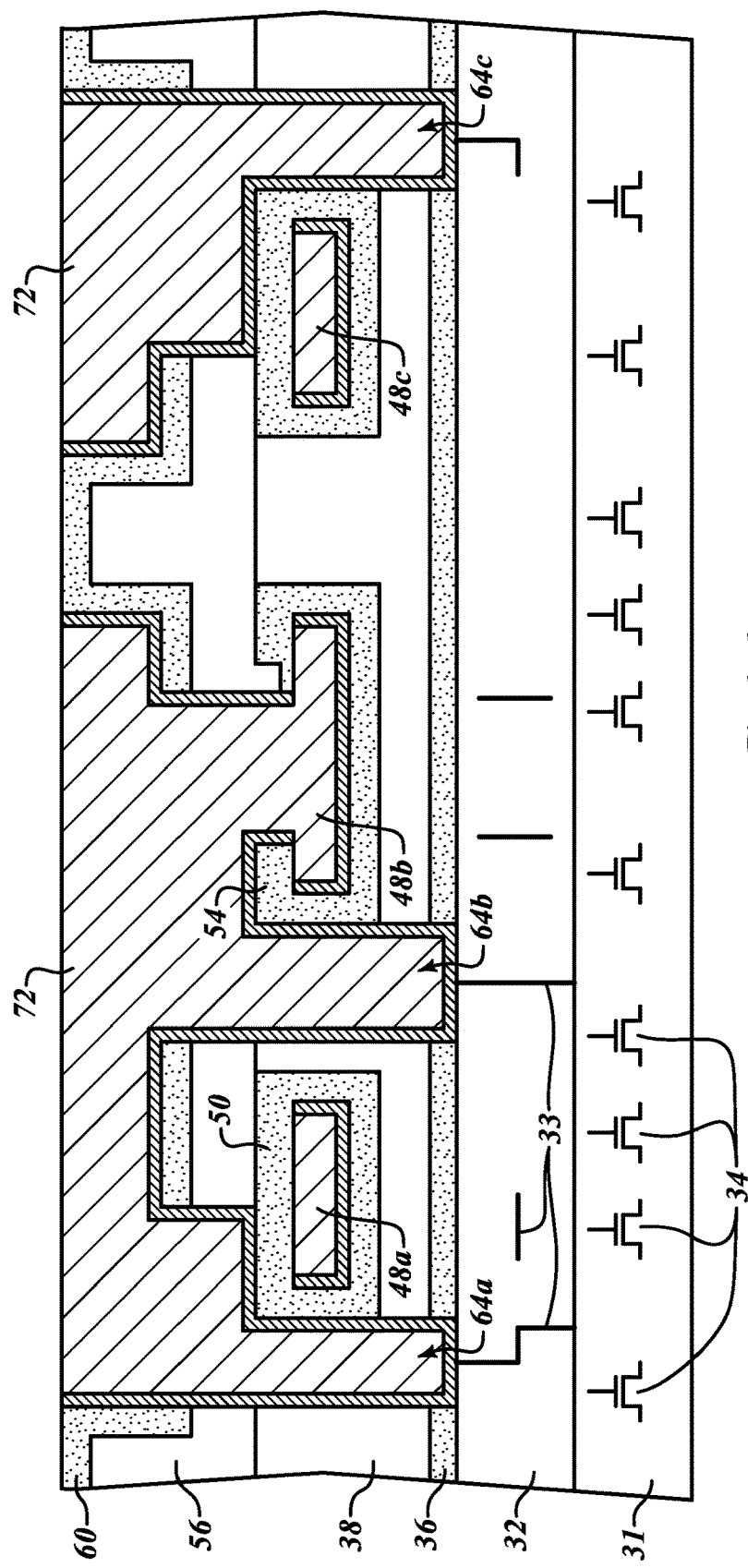
FIG. 16 is a cross section of an integrated circuit die having the metal layer planarized according to one embodiment.
Figure 17:
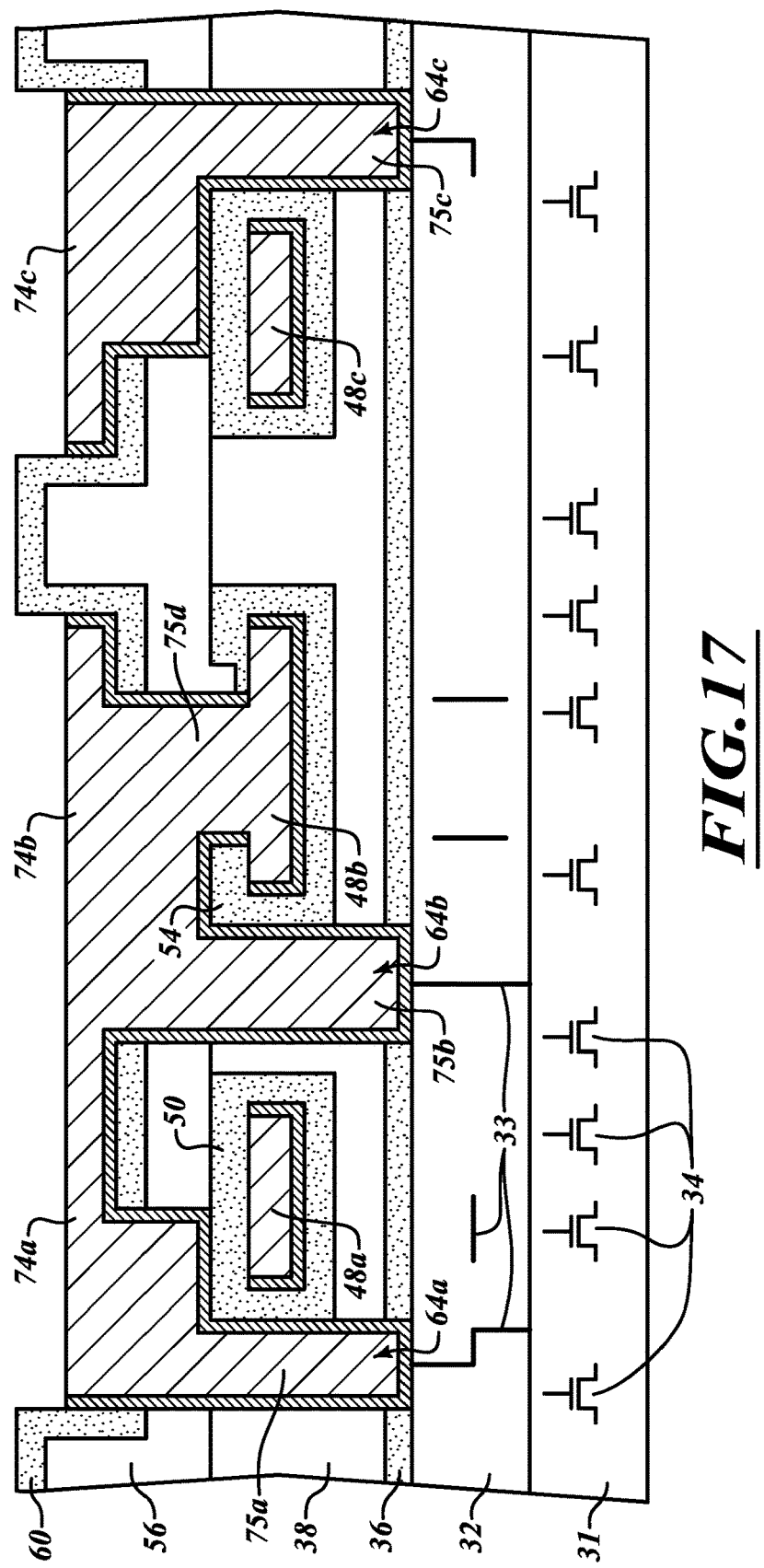
FIG. 17 is a cross section of an integrated circuit die after a portion of the metal layer has been removed according to one embodiment.

In FIG. 16, a planarization process is performed as described previously. The planarization process removes excess portions of the conductive material 72, portions of the intermetal dielectric layer 56 and barrier layer 70. The chemical mechanical planarization process can be a timed process or can be configured to stop, for example, on the middle portion of the second intermetal dielectric layer 56 which rests on top of the first metal tracks 48a, 48b, and 48c. In this manner, second metal tracks 74a, 74b and 74c are formed from the conductive material 72 and the barrier layer 70. At the same time, conductive plugs 75a, 75b, 75c, and 75d are formed in the vias 64a, 64b, 64c, and 66. The second metal tracks 74a, 74b, and 74c are connected by plugs 75a, 75b, and 75c to metal interconnections 33 below the protective dielectric layer 36. The metal track 74b is also connected to the metal track 48b by the direct via 66 filled with plug 75d. Thus, a single process is used to fill the vias and form the second metal tracks 74a, 74b, and 74c. This allows relaxed photolithographic constraints, reduced photolithographic steps, a reduced number of metal deposition steps, improved protection against electromigration and time-dependent dielectric breakdown.

Figure 18:
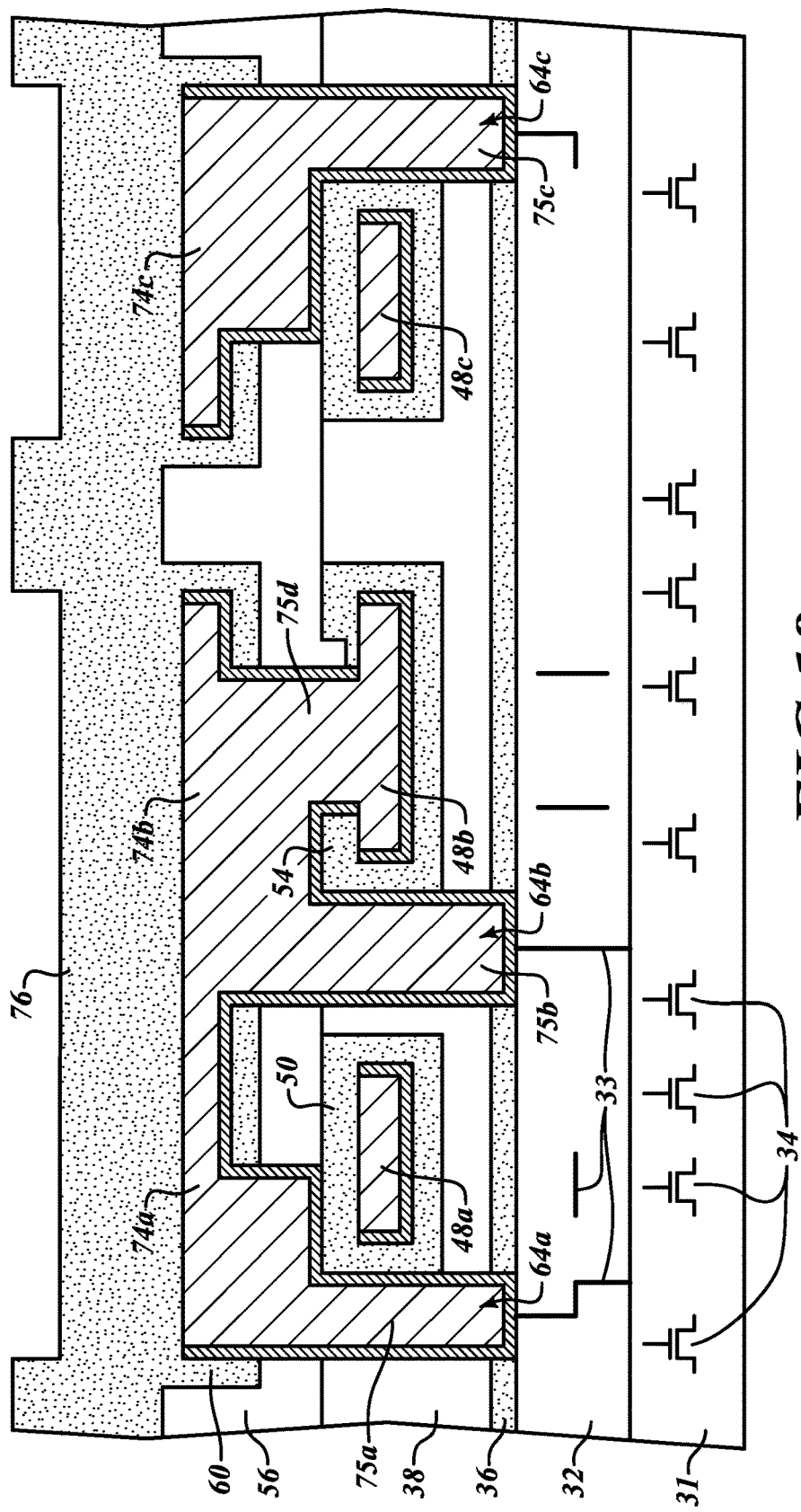
FIG. 18 is a cross section of an integrated circuit die after a protective dielectric layer has been formed on the metal layer according to one embodiment.
Figure 19:
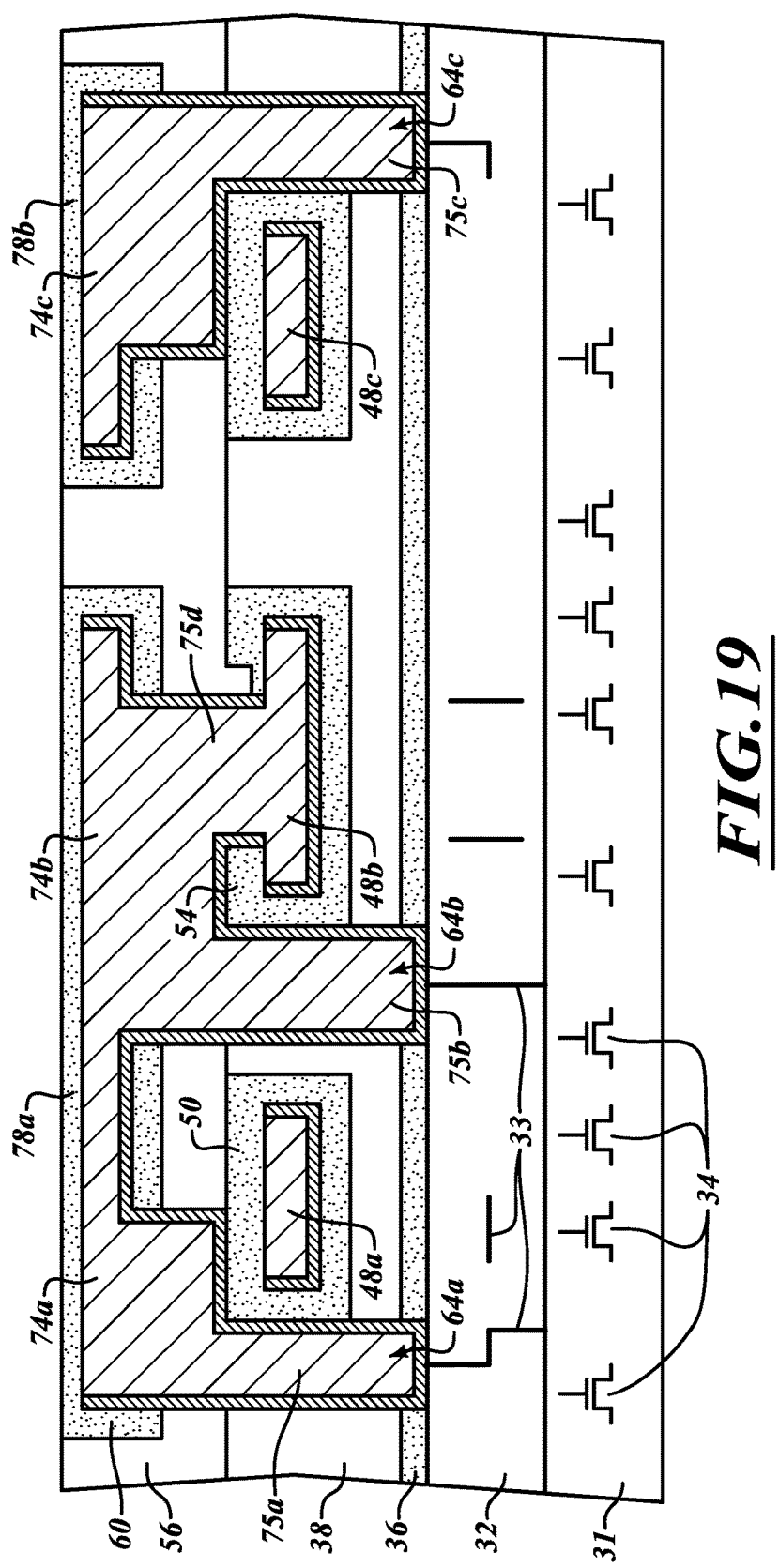
FIG. 19 is a cross section of an integrated circuit die after the protective dielectric layer has been planarized according to one embodiment.

In FIG. 18, a protective dielectric layer 76 is deposited on the dielectric layer 56, the metal tracks 74a, 74b, and 74c, and on the exposed portions of the protective dielectric layer 60. The protective dielectric layer 76 is preferably of the same material as the protective dielectric layer 60, but may also be chosen from other suitable materials. In FIG. 19 a planarization process is performed to planarize the protective dielectric layer 76. This planarization process leaves dielectric encapsulation layers 78a and 78b on and under the metal tracks 74a, 74b and 74c.

Figure 20:
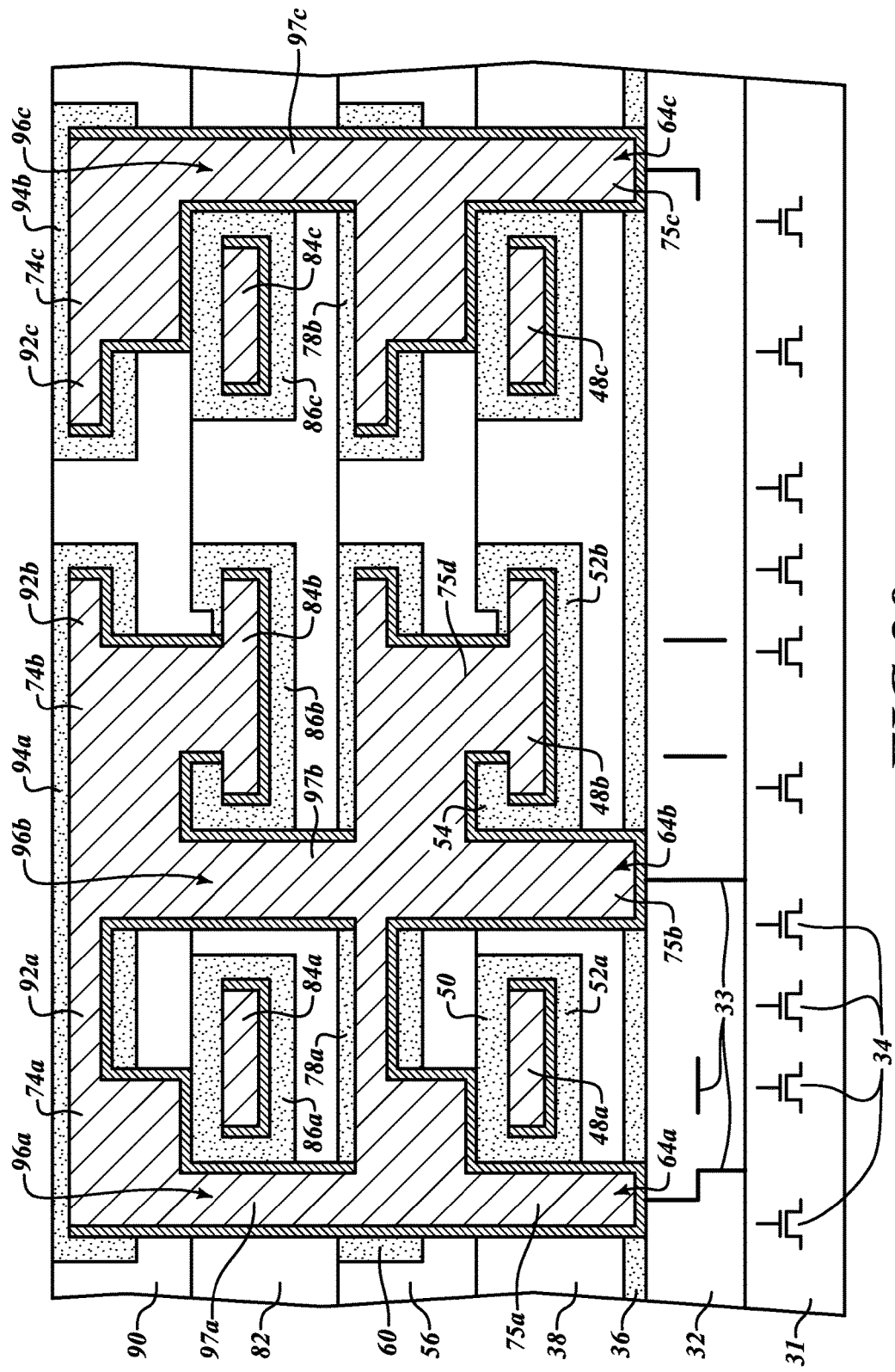
FIG. 20 is a cross section of an integrated circuit die after the steps of FIGS. 1-19 have been repeated to form additional metal layers according to one embodiment.

FIG. 20 depicts an integrated circuit that results after the process described in relation to FIGS. 1-19 has been repeated to provide very high density metal line connections. In particular, a third intermetal dielectric layer 82 has been formed on the second intermetal dielectric layer 56 and the dielectric encapsulation layers 78a and 78b. Metal tracks 84a, 84b, and 84c have been formed and covered in dielectric encapsulation layers 86a, 86b, and 86c. A fourth intermetal dielectric layer 90 has been formed on the third intermetal dielectric layer 82. Fourth metal lines 92a, 92b, and 92c have been formed in the fourth intermetal dielectric layer 90. The vias 96a, 96b, and 96c are filled with conductive plugs 97a, 97b, and 97c to electrically connect the fourth metal tracks 92a, 92b, and 92c with the second metal tracks 74a, 74b, 74c. The dielectric encapsulation layers 86a, 86b, 86c again act as etch masks in forming the vias 96a, 96b, 96c as described previously. The vias 96a, 96b, and 96c join respectively with vias 64a, 64b, and 64c to form unitary vias extending through the first, second, third, and fourth intermetal dielectric layers 38, 56, 82, and 90 respectively.

The metal interconnections shown in FIG. 20 are formed with relaxed lithographic constraints due to the dielectric encapsulation layers around the metal tracks. The dielectric encapsulation layers also provide for more robust interconnect lines that are resistant to breakdown as described previously. The metal interconnections can be formed differently than shown in FIG. 20. For example, the metal tracks 92a, 92b can be electrically isolated from each other, as can the metal tracks 74a, 74b. More or fewer direct vias can be formed. Many interconnect structures and patterns different than those shown in the figures can be formed according to principles of the present disclosure. All such other interconnect structures and patterns fall within the scope of the present disclosure.

FIG. 21 illustrates an integrated circuit die 30 having metal interconnect structures formed according to one embodiment using principles of the present disclosure as described in relation to FIGS. 1-20. The same reference numbers have been used to describe features analogous to those of FIG. 20. In FIG. 21, the metal tracks 92a, 92b, and 92c are electrically isolated from each other, as are metal tracks 74a, 74b, and 74c. The metal lines 92a, 92b, and 92c are each covered in respective dielectric encapsulation layers 94a, 94b, and 94c. Respective dielectric protection layers 78a, 78b, and 78c cover metal lines 74a, 74b, and 74c. A direct via connects the metal lines 74a and 48a.

FIG. 22 illustrates an integrated circuit die 30 having double foot branch structure 100 formed according to one embodiment. The vias, 64b, 64d, and the trench for metal line 74b are formed and filled in a single etch step using the dielectric encapsulation layer 52b as an etch mask due to the etch selectivity with of the dielectric encapsulation layer 52b with respect to the intermetal dielectric layers 38 and 56. The vias 64b, 64d, and the metal line 74b are filled in a single metal deposition, as described previously. Vias 96b, 96d, and metal line 92b are formed and filled in the same manner as the vias 64b, 64d, and metal line 74b. In this manner a double foot branch conductive structure 100 can be formed using trench only lithography.

FIG. 23 is an integrated circuit die having double foot branches 100 as well as other metal interconnections according to one embodiment. The metal tracks 74a, 74c, and 92a, 92c are formed in the same manner as the metal lines 92b, and 74b as described in FIG. 22. A double metal foot branch 100 is formed in the same manner as the double metal foot branch 100 formed in FIG. 22.

Further dielectric layers can be formed over the fourth intermetal dielectric layer 90 in accordance with known processes for forming integrated circuit dies. Eventually passivation layers can be formed over the fourth intermetal dielectric layer 90, contact pads can be formed on the passivation layers to provide connections to the transistors 34 through the metal tracks and vias in the integrated circuit die 30. Finally, the integrated circuit die can be encapsulated in a molding compound and provided with solder balls, leads, or pins coupled to the contact pads so that the integrated circuit die can be installed in an electronic component such as on a circuit board or other suitable location. Many processes and structures for forming an integrated circuit die have not been described in detail in this disclosure. Such other processes and structures are known to those of skill in the art or can be implemented in light of the present disclosure.

The features in the figures are not drawn to scale, as will be understood by those of skill in the art. The structures in the figures as drawn may not properly satisfy the relationships described herein. The processes and structures described in relation to FIGS. 1-23 are given by way of example. Other types of materials, thickness, widths, structures and patterns can be used in accordance with principles of the present disclosure. All such alternative embodiments fall within the scope of the present disclosure.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   a semiconductor substrate;
   a plurality of transistors in the semiconductor substrate;
   a first intermetal dielectric layer overlying the semiconductor substrate;
   a plurality of first metal tracks overlying the first intermetal dielectric layer;
   a first protective dielectric layer encapsulating each of the first metal tracks on at least three sides;
   a second intermetal dielectric layer overlying the first metal tracks and the first protective dielectric layer;
   a plurality of second metal tracks overlying the second intermetal dielectric layer;
   a second protective dielectric layer encapsulating each of the second metal tracks on at least three sides, the first and second intermetal dielectric layers being selectively etchable with respect to the first and second protective dielectric layers; and
   a plurality of L-shaped unitary vias extending between selected ones of the first and second metal tracks, each L-shaped unitary via having a first section of a first substantially uniform width directly below a second section of a second, different, substantially uniform width.

2. The device of claim 1 wherein the first protective dielectric layer forms at least one sidewall that determines the first substantially uniform width of each L-shaped unitary via.

3. The device of claim 1 wherein a first L-shaped unitary via of the plurality of L-shaped unitary vias is integral with at least one of the second metal tracks.

4. The device of claim 3 comprising:
   a third intermetal dielectric layer overlying the second intermetal dielectric layer;
   a plurality of third metal tracks overlying the third intermetal dielectric layer;
   a third protective dielectric layer encapsulating each of the third metal tracks on at least three sides;
   a fourth intermetal dielectric layer overlying the plurality of third metal tracks and the third protective dielectric layer;
   a plurality of fourth metal tracks overlying the fourth intermetal dielectric layer; and
   a fourth protective dielectric layer encapsulating each of the fourth metal tracks on at least three sides.

5. The device of claim 4 comprising a second unitary via in the third and fourth intermetal dielectric layers that includes the first L-shaped unitary via.

6. The device of claim 5 wherein the second unitary via electrically couples at least one of the fourth metal tracks to at least one of the second metal tracks.

7. The device of claim 1 wherein the first protective dielectric layer includes silicon nitride.

8. The device of claim 7 wherein the first protective dielectric layer includes carbon.

9. The device of claim 8 wherein the first protective dielectric layer has a thickness less than 50 nm and the first intermetal dielectric layer has a thickness greater than 100 nm.

10. The device of claim 1 wherein the first substantially uniform width is less than the second substantially uniform width.

11. A device comprising:
    a semiconductor substrate;
    a first intermetal dielectric layer overlying the semiconductor substrate;
    a first metal track overlying the first intermetal dielectric layer;
    a first protective dielectric layer encapsulating the first metal track on at least three sides;
    a second intermetal dielectric layer overlying the first metal track and the first protective dielectric layer;
    a second metal track on the second intermetal dielectric layer;
    a second protective dielectric layer encapsulating the second metal track on at least three sides; and
    a unitary via in the first and second intermetal dielectric layers, the unitary via having a first section of a first substantially uniform width directly below a second section of a second, different, substantially uniform width.

12. The device of claim 11 wherein the unitary via couples the second metal track with the first metal track.

13. The device of claim 12 wherein the unitary via and the second metal track are integral with each other.

14. The device of claim 11 wherein the first and second metal tracks together with the unitary via form a double foot branch interconnect structure.

15. The device of claim 11 wherein a section of the unitary via having a narrow width is located underneath a wider section of the unitary via.

16. A device comprising:
    a semiconductor substrate;
    a plurality of transistors in the semiconductor substrate;
    a first intermetal dielectric layer overlying the semiconductor substrate;
    a plurality of first metal tracks overlying the first intermetal dielectric layer;
    a first protective dielectric layer encapsulating each of the first metal tracks on at least three sides;
    a second intermetal dielectric layer overlying the first metal tracks and the first protective dielectric layer;
    a plurality of second metal tracks overlying the second intermetal dielectric layer; a second protective dielectric layer encapsulating each of the second metal tracks on at least three sides, the first and second intermetal dielectric layers being selectively etchable with respect to the first and second protective dielectric layers;
    a plurality of unitary vias coupling selected ones of the first and second metal tracks, the unitary vias having sections of different widths, the first protective dielectric layer forming at least one sidewall that determines a first width of the unitary via;
    a first conductive plug in the unitary via, the first conductive plug being integral with the at least one of the second metal tracks;
    a third intermetal dielectric layer overlying the second intermetal dielectric layer;
    a plurality of third metal tracks overlying the third intermetal dielectric layer;

a third protective dielectric layer encapsulating each of the third metal tracks on at least three sides;

a fourth intermetal dielectric layer overlying the plurality of third metal tracks and the third protective dielectric layer;

a plurality of fourth metal tracks overlying the fourth intermetal dielectric layer;

a fourth protective dielectric layer encapsulating each of the fourth metal tracks on at least three sides; and a unitary via in the third and fourth intermetal dielectric layers exposing the first conductive plug.

17. The device of claim 16, further comprising a second conductive plug in the unitary via, the second conductive plug electrically coupling selected ones of the plurality of fourth metal tracks and the plurality of second metal tracks.

18. A device, comprising:

a substrate;

a first metal track on the substrate;

a second metal track on the substrate, the second metal track being spaced apart from the first metal track;

a dielectric layer having a first portion and a second portion, the first portion of the dielectric layer completely surrounding four sides of the first metal track, the second portion of the dielectric layer being on the second metal track and having an opening in which the second portion of the dielectric layer is not on a part of a surface of the second metal track; and a unitary via having a vertical narrow portion extending between the first metal track and the second metal track and a horizontal wide portion that couples to the vertical narrow portion, the horizontal wide portion of the unitary via being positioned in the opening and being physically and electrically coupled to the part of the surface of the second metal track.

19. The device of claim 18 wherein the unitary via is L-shaped.

* * * * *